(12) United States Patent
Morelos-Zaragoza

(10) Patent No.: US 6,751,770 B2
(45) Date of Patent: Jun. 15, 2004

(54) DECODER FOR ITERATIVE DECODING OF BINARY CYCLIC CODES

(75) Inventor: Robert Morelos-Zaragoza, Tokyo (JP)

(73) Assignee: Sony Corporation, Tokyo (JP)

( * ) Notice: Subject to any disclaimer, the term of this patent is extended or adjusted under 35 U.S.C. 154(b) by 319 days.

(21) Appl. No.: 09/974,675

(22) Filed: Oct. 10, 2001

(65) Prior Publication Data

US 2002/0116677 A1 Aug. 22, 2002

(30) Foreign Application Priority Data

Oct. 11, 2000 (JP) ........................................ 2000-311095

(51) Int. Cl.[7] .............................................. H03M 13/00
(52) U.S. Cl. ........................................ 714/781; 714/758
(58) Field of Search ................................. 714/758, 781, 714/782, 783, 785, 784

(56) References Cited

U.S. PATENT DOCUMENTS 6,460,162 B1 * 10/2002 Buda et al. .................. 714/807
6,499,128 B1 * 12/2002 Gerlach et al. .............. 714/755
6,539,367 B1 * 3/2003 Blanksby et al. ............. 706/14
6,671,852 B1 * 12/2003 Ariel et al. .................. 714/793

* cited by examiner

Primary Examiner—Albert Decady
Assistant Examiner—Joseph D. Torres
(74) Attorney, Agent, or Firm—Frommer Lawrence & Haug LLP; William S. Frommer

(57) ABSTRACT

A decoder for performing soft decision iterative decoding of a cyclic code based on belief propagation, includes an information exchange control unit, an X processor, and a Z processor. The information exchange control unit takes $\pi_x$-metrics that were calculated by the X processor for nonzero elements in each of n-cyclic shifts of the parity-check polynomial of the code, and distributes the $\pi_x$-metrics to the Z processor as the $\pi_z$-metrics for a corresponding check node. The information exchange control unit takes $\lambda_z$-metrics that were calculated by the Z processor for nonzero elements in each of n-cyclic shifts in a reverse order of the parity-check polynomial, and distributes them to the X processor as $\lambda_x$-metrics for the corresponding code node. The operation of the information exchange control unit can be represented by the Tanner graph associated with an extended parity-check matrix, which is produced by adding k rows to the parity-check matrix of the cyclic code.

11 Claims, 14 Drawing Sheets

| | | | π RAM | | | |
|---|---|---|---|---|---|---|
| i = 0 | 1 | 2 | 3 | 4 | 5 | 6 |
| (0,0) | (1,1) | (2,2) | (0,1) | (1,2) | (0,2) | (0,3) |
| (1,0) | (2,1) | (3,1) | (3,2) | (4,3) | (2,3) | (1,3) |
| (2,0) | (3,0) | (4,1) | (4,2) | (5,2) | (5,3) | (3,3) |
| (4,0) | (5,0) | (6,0) | (5,1) | (6,1) | (6,2) | (6,3) |

FIG. 16

| | | | λ RAM | | | |
|---|---|---|---|---|---|---|
| i = 0 | 1 | 2 | 3 | 4 | 5 | 6 |
| (0,0) | (0,1) | (0,2) | (1,2) | (0,3) | (1,3) | (2,3) |
| (3,0) | (1,0) | (1,1) | (2,1) | (2,2) | (3,3) | (4,3) |
| (5,0) | (4,0) | (2,0) | (3,1) | (3,2) | (4,2) | (5,3) |
| (6,0) | (6,1) | (5,1) | (6,2) | (4,1) | (5,2) | (6,3) |

FIG. 17

DECODER FOR ITERATIVE DECODING OF BINARY CYCLIC CODES

BACKGROUND OF THE INVENTION

1. Field of the Invention

The present invention relates to a decoder for performing iterative decoding of binary cyclic codes.

2. Description of the Related Art

Cyclic codes are attractive because encoding can be performed systematically and can also be easily implemented using shift-registers with feedback connections.

Iterative soft-decision decoders use the values of the matched filter outputs in a digital receiver. This contrasts with hard-decision decoders, which use bits based on the sign of the matched filter outputs. Soft decision decoders have better performance than hard-decision decoders, of about 2 dB improvement in bit signal-to-noise ratio. A soft-decision decoder for a binary cyclic code uses the Viterbi algorithm applied to a trellis.

SUMMARY OF THE INVENTION

It is conceivable to make a soft-decision decoder for decoding many different binary cyclic codes. However, such a conceivable decoder would require a different trellis structure for each cyclic code. This would require a great deal of memory and hardware, because different trellises have different sizes, that is, the number of states and number of branches, and also different structures.

It is desirable if a single decoder configuration could be used for decoding more than a specific family of binary cyclic codes.

The present inventor has discovered that iterative decoding of (n,k) binary cyclic codes based on belief propagation produces only poor results. These poor results are thought to be because an (n-k)-by-n parity-check matrix of an (n,k) binary cyclic code has columns with very low Hamming weights, that is, with only one nonzero element.

It is also desirable to produce a decoder that can decode binary cyclic codes using iterative decoding based on belief propagation with good results and using a simple configuration.

It is an objective of the present invention to provide a decoder capable of decoding many different families of cyclic codes.

It is another objective of the present invention to produce a decoder that can decode binary cyclic codes using iterative decoding based on belief propagation with good results.

A decoder according to the present invention is for decoding a data stream from a noisy channel into estimated bits. Before the data stream was transmitted across the noisy channel, it was encoded by an encoder according to a cyclic code into a plurality of code words in sequence.

In order to achieve the above-described objectives, the decoder according to the present invention includes an input means, a scaler, a Z processor, an X processor, and an information exchange control unit.

The input means receives input of a vector of noisy received values $r(i)$ (where $0 \leq i \leq n-1$) of the data stream, a code length n of the code words, and a parity-check polynomial $h(x)$ corresponding to the cyclic code. The parity-check polynomial $h(x)$ has J-number of nonzero coefficients.

The scaler multiplies each noisy received value $r(i)$ by a constant, and outputs each product as a log-likelihood ratio $LLR(i)$.

The Z processor receives n-sets of $\pi z(i,j)$ metrics (where $0 \leq j \leq J-1$), each set including J-number of $\pi z(i,j)$ metrics. The Z processor calculates n-sets of $\lambda z(i,j)$ metrics based on the $\pi z(i,j)$ metrics, each set including J-number of $\lambda z(i,j)$ metrics.

The X processor receives n-sets of $\lambda x(i,j)$ metrics, each set including J-number of $\lambda x(i,j)$ metrics. The X processor calculates n-number of a-posteriori values $q(i)$ based on the $\lambda x(i,j)$ metrics and the log-likelihood ratios $LLR(i)$. The X processor calculates n-sets of $\pi x(i,j)$ metrics based on the $\lambda x(i,j)$ metrics and the a-posteriori values $q(i)$, each set including J-number of $\pi x(i,j)$ metrics. The X processor determines n-number of estimated code bits $\hat{a}_i$ based on the a-posteriori values $q(i)$.

The information exchange control unit distributes the $\pi x(i,j)$ metrics based on a cyclic shift of the parity-check polynomial $h(x)$ to produce the $\pi z(i,j)$ metrics. The information exchange control unit distributes the $\lambda z(i,j)$ metrics based on a reverse order of the cyclic shift of the parity-check polynomial $h(x)$ to produce the $\lambda x(i,j)$ metrics.

With this configuration, iterative soft decision decoding can be performed using the same simple configuration to decode cyclic codes from many different families of cyclic codes. Binary cyclic codes can be iteratively decoded based on belief propagation with good results.

It is desirable that the decoder further include a $\pi$ RAM and a $\lambda$ RAM. The $\pi$ RAM is connected to an output of the X processor and an input of the Z processor. The $\lambda$ RAM is connected to an output of the Z processor and an input of the X processor.

The information exchange control unit organizes the $\pi$ RAM into a J-by-n array with J columns and n rows based on the inputted code length n and the inputted parity-check polynomial $h(x)$. The information exchange control unit distributes the $\pi x(i,j)$ metrics from the X processor into the $\pi$ RAM based on the cyclic shift of the parity-check polynomial $h(x)$, and transfers to the Z processor the J-number of $\pi x(i,j)$ metrics in each column of the $\pi$ RAM as one of the n-sets of $\pi z(i,j)$ metrics.

The information exchange control unit organizes the $\lambda$ RAM into a J-by-n array with J columns and n rows based on the inputted code length n and the inputted parity-check polynomial $h(x)$. The information exchange control unit distributes the $\lambda z(i,j)$ metrics from the Z processor into the $\lambda$ RAM based on the reverse order of the cyclic shift of the parity-check polynomial $h(x)$, and transfers to the X processor the J-number of $\lambda z(i,j)$ metrics in each column of the $\lambda$ RAM as one of the n-sets of $\lambda x(i,j)$ metrics.

With this configuration, the decoder according to the present invention can be realized in a serial configuration, using a minimal of hardware.

Alternatively, it is desirable that the decoder further includes a bus connecting the Z processor, the X processor, and the information exchange control unit to each other. In this case, the Z processor includes n-number of $Z_i$ processors each connected to the bus with an individual address, and the X processor includes n-number of $X_i$ processors each connected to the bus with an individual address. The information exchange control unit includes an address computation unit for transferring, across the bus, the $\pi x(i,j)$ metrics from the $X_i$ processors as $\pi z(i,j)$ metrics to $Z_i$ processors determined based on the cyclic shift of the parity-check polynomial $h(x)$ and the $\lambda z(i,j)$ metrics from the $Z_i$ processors as $\lambda x(i,j)$ metrics to $X_i$ processors determined based on the reverse order of the cyclic shift of the parity-check polynomial $h(x)$.

With this configuration, the decoder according to the present invention can be realized in a fast parallel configuration.

It is desirable that the Z processor compute the $\lambda z(i,j)$ metrics based on:

$$\lambda_z(i,j)=(-1)^{\delta \oplus sgn\ (\pi_z(i,\ j))}(S-F_Q(|\pi_z(i,j)|))$$

wherein:

$$S = (-1)^\delta \sum_{j=0}^{J-1} F_Q(|\pi_z(i,\ j)|),$$

$\delta=(-1)^{\oplus_{j=0}j-1sgn\ (\pi_z(i,j))}$, and p1 $F_Q$ (x) denotes a quantized version of the function $F(x)=\log[(e^x+1)/(e^x-1)]$.

With this configuration, the $\lambda z(i,j)$ metrics can be reliably computed. In this case, it is desirable that the Z processor computes the $\lambda z(i,j)$ metrics using the following quantized version $F_Q$ (x) of the function $F(X)=\log[(e^x+1)/(e^x-1)]$, because almost the same results can be obtained as with no quantization, but with much simpler computations:

$$F_Q(x) = \begin{cases} 5.00, & 0 \le x \le 0.10; \\ 2.25, & 0.10 \le x \le 0.35; \\ 1.50, & 0.35 \le x \le 0.60; \\ 1.00, & 0.60 \le x \le 0.90; \\ 0.75, & 0.90 \le x \le 1.20; \\ 0.50, & 1.20 \le x \le 1.60; \\ 0.30, & 1.60 \le x \le 2.30 \\ 0.10, & 2.30 \le x. \end{cases}$$

It is desirable that the X processor calculate the a-posteriori values q(i) based on $$q(i) = \sum_{j=0}^{J-1} \lambda_x(i,\ j) + LLR(i),$$

calculate the $\pi x(i,j)$ metrics based on $\pi_x(i,j)=q(i)-\lambda_x(i,\ j)$, and determine the n-number of estimated code bits based on $\hat{a}_i$=sgn (q(i)). With this configuration, the a-posteriori values q(i) can be reliably calculated.

It is desirable that the constant used by the scaler equals 4/spectral density No of the noisy channel. With this configuration, overflow, which occurs when probabilities of a "0" or a "1" are too close to 1 or 0, can be reliably prevented from occurring.

It is desirable that the input means further receives input of a fixed number of iterations. In this case, the X processor determines the n-number of estimated code bits $\hat{a}_i$ after the fixed number of iterations. With this configuration, decoding delay is fixed. As a result, no buffers are required when data is delivered to its destination, so that hardware configuration is simpler.

It is desirable that the information exchange control unit perform the cyclic shifts of the parity-check polynomial h(x) by multiplying successive ones of $x^0$ to $x^{n-1}$ times the parity-check polynomial h(x) and performs the reverse order of the cyclic shifts of the parity-check polynomial h(x) by multiplying successive ones of $x^0$ to $x^{n-1}$ times the reciprocal $h^{-1}(x)$ ($x^n\ h(x^{-1})$) of the parity-check polynomial h(x). With this configuration, there is no need to store the entire parity-check matrix; the parity-check polynomial and the code length are all that need to be inputted.

It is desirable that, in a first iteration, the X processor makes preliminary hard decisions on the a-posteriori values q(i) to produce hard decision values for highly reliable positions. In this case, the information exchange control unit uses the hard decisions when distributing the $\pi x(i,j)$ metrics and the $\lambda z(i,j)$ metrics. With this configuration, decoding can be performed much more easily without any significant increase in decoding errors. In this case, it is desirable that the Z processor makes the preliminary hard decisions based on whether a a-posteriori value q(i) exceeds a threshold T, because this enables designating highly reliable positions with a simple configuration.

BRIEF DESCRIPTION OF THE DRAWINGS

The above and other objects, features and advantages of the invention will become more apparent from reading the following description of the embodiment taken in connection with the accompanying drawings in which:

FIG. 16 is a schematic view showing a π RAM of the X-to-Z propagation unit shown in FIG. 12, stored with the metrics πx(i,j);

FIG. 17 is a schematic view showing a λ RAM of the Z-to-X propagation unit shown in FIG. 12, stored with metrics λz(i, i);

DETAILED DESCRIPTION OF THE EMBODIMENT

Next, a decoder according to the embodiment of the present invention will be described while referring to the accompanying drawings.

Figure 1:
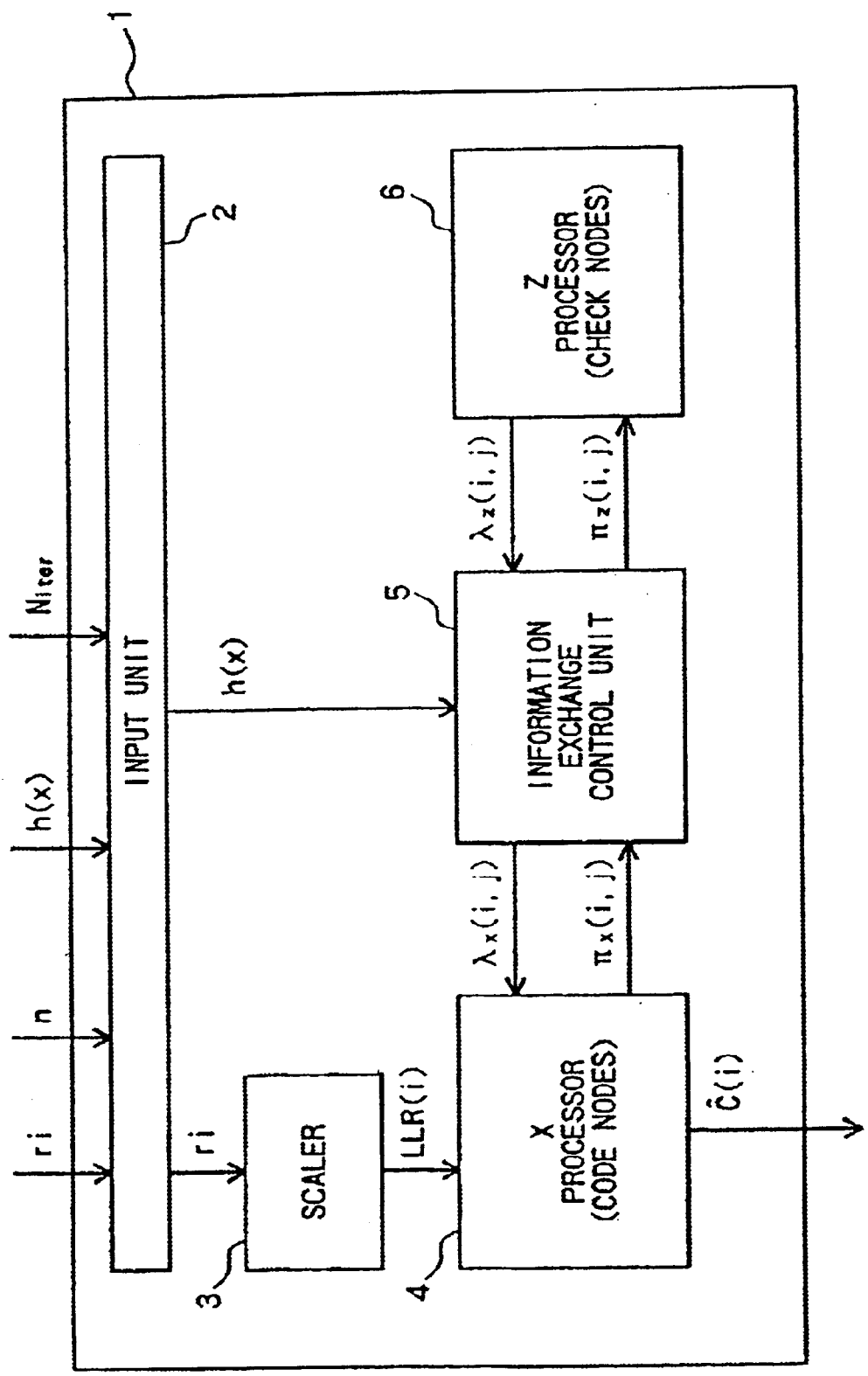
FIG. 1 is a block diagram showing functional components of a decoder according to an embodiment of the present invention.

FIG. 1 is a block diagram showing functional components of a decoder 1 according to the embodiment of the present invention. The decoder 1 includes an input unit 2, a scaler 3, an X processor 4, an information exchange control unit 5, and a Z processor 6.

The decoder 1 is for decoding a binary transmission of a data stream, which was transmitted across a noisy channel, into n-number of estimated bits $\exists_i$. In the embodiment, it is assumed that binary transmission with energy per symbol Es (i.e., "0" and "1" are transmitted as $+\sqrt{E_s}$ and $-\sqrt{E_s}$ respectively) takes place over an additive white Gaussian noise (AWGN) channel with one-sided spectral density $N_0$.

Before the data stream is transmitted across the noisy channel, an encoder follows the conventional manner of encoding to encode the data stream according to a binary cyclic (n,k) code C, into a plurality of code words in sequence. Here, processes performed by the encoder to encode the data stream according to a cyclic (n,k) code C will be briefly explained.

A cyclic (n,k) code C has a code length n and a message (information sequence) length k. The cyclic code C is associated with a generator polynomial g(x) and a parity-check polynomial $h(x)=(x^n-1)/g(x)=h_0+h_1 x+ \ldots +h_k x^k$. The parity-check polynomial h(x) can be represented by the parity-check matrix H of the following equation:

$$H = \begin{pmatrix} h_0 & h_1 & \Lambda & & h_k & 0 & 0 & \Lambda & 0 \\ 0 & h_0 & h_1 & h_2 & \Lambda & h_k & 0 & \Lambda & 0 \\ 0 & 0 & h_0 & h_1 & h_2 & \Lambda & h_k & \Lambda & 0 \\ 0 & 0 & 0 & 0 & 0 & 0 & 0 & 0 & M \\ 0 & 0 & 0 & 0 & 0 & \Lambda & \Lambda & \Lambda & h_k \end{pmatrix} \quad (1)$$

Each row of the parity-check matrix H of equation (1) has j-number of nonzero elements. The elements in the j-th row of the parity-check matrix H of equation (1) are the coefficients of the cyclic shift $x^j h(x) \mod (x^n-1)$, j=0, 1, ..., n−k−1.

The encoder encodes the data stream in a systematic manner as follows. Message symbols to be encoded are the coefficients mλ ∈ GF(q), λ=0, 1, ..., k−1 of an information polynomial $m(x)=m_0+m_1 x+ \ldots +m_{k-1}$ of degree k−1. A code polynomial c(x) in the cyclic code C corresponds to the information polynomial m(x).

During the first step, code symbols cλ are the same as the coefficients mλ, for λ=0, 1, ..., k−1. Because the code has a cyclic structure, during subsequent steps, (n−k) redundant symbols cλ, λ=k, k+1, ..., n−1 are obtained recursively via the parity-check relations:

$$C_\lambda = \sum_{j=0}^{\lambda-1} C_j \otimes H_j^{(\lambda-k)}, \lambda = k, k+1, \ldots, n-1$$

where addition is over GF(q); ⊗ denotes multiplication over GF(q); and $H_j^{(\lambda-k)}$ denotes the j-th entry in the (λ−k)-th row of parity-check matrix H.

The above-described example of systematic encoding with a cyclic code C assumes a code rate k/n of less than or equal to 0.5, so encoding is performed by recursion with the parity-check polynomial h(x). For cyclic (n,k) codes with a code rate k/n greater than 0.5, encoding is more efficient by dividing $x^{n-k}m(x)$ by the generator polynomial g(x).

Either way, that is, by recursion with the parity-check polynomial h(x) or division by the generator polynomial g(x), the coefficients of the code polynomials are in systematic form, so that the first k coefficients are the message symbols, and the remaining n−k coefficients constitute the redundant symbols.

For example, consider the binary cyclic (7,4) Hamming code with parity-check polynomial $h(x)=1+x+x^2+x^4$, and parity-check matrix H in the following equation:

$$H = \begin{pmatrix} 1 & 1 & 1 & 0 & 1 & 0 & 0 \\ 0 & 1 & 1 & 1 & 0 & 1 & 0 \\ 0 & 0 & 1 & 1 & 1 & 0 & 1 \end{pmatrix} \quad (2)$$

A message $\overline{m}=(m_0, m_1, m_2, m_3)$ is encoded as a codeword $\overline{C}=(C_0, C_1, \ldots, C_6)$, by first letting $c_\lambda=m_\lambda$, λ=0, 1, 2, 3, and then solving the redundant positions:

$C_4=C_0 \oplus C_1 \oplus C_2$
$C_5=C_1 \oplus C_2 \oplus C_3$
$C_6=C_2 \oplus C_3 \oplus C_4$ With respect to its encoding process, the encoder is the same as a conventional encoder for encoding a binary cyclic code. However, according to the embodiment, the transmitter that includes the encoder also transmits, for example in a header, information relating to the binary cyclic (n,k) code C, such as the parity-check polynomial h(x) associated with the code, the code length, positions of the coefficients of the parity-check polynomial, and optionally the Hamming weights J of the parity-check polynomial.

The input unit 2 of the decoder 1 receives the data stream encoded in this manner as a vector of noisy received (soft) symbol values r(i) (where 0≤i≤n−1) that have received influence of the noisy channel. The input unit 2 is also input with the parameters of the code length n of the code words and the positions of the coefficients of the parity-check polynomial h(x) of the binary cyclic code C. The total number of input parameters is J+2 integers, or approximately (J+2) $\log_2$ n bits. The parity-check polynomial h(x) has a Hamming weight J, and this value J can be input optionally. The input unit 2 can also be input with a fixed number of iterations $N_{iter}$, which sets how many iterations are to be performed.

The input unit 2 passes the received values r(i), i ∈ {0, 1, ..., n−1} to the scaler 3, and the parity-check polynomial h(x) to the information exchange control unit 5. Although not shown in FIG. 1, the input unit 2 also passes the code length n and the fixed number of iterations Niter to the scaler 3, the X processor 4, the information exchange control unit 5, and the Z processor 6.

The scaler 3 receives the noisy received values r(i) and the code length n from the input unit 2, and for i ∈ {0, 1, ..., n−1} multiplies each noisy received value r(i) by a constant $4/N_0$ $(=2/\sigma^2)$, which is inversely proportional to the noise variance $N_0/2$ $(=\sigma^2)$. The scaler 3 outputs each product as the logarithm of the likelihood ratio, that is, the log-likelihood ratio LLR(i), of each received symbol r(i). The operation of the scaler 3 can be represented by the following formula:

$$LLR(i) = r_i^* \frac{4}{N_0}$$

The X processor 4 calculates $^\pi$x-metrics based on the LLR (i) from the scaler 3 and $^\lambda$x-metrics from the information exchange control unit 5. The Z processor 6 produces $^\lambda$z-metrics based on $^\pi$z-metrics from the information exchange control unit 5. The information exchange control unit 5 distributes the $^\pi$x-metrics from the X processor 4 to the Z processor 6 as the $^\pi$z-metrics, and distributes the $^\lambda$z-metrics from the Z processor 6 to the X processor 4 as the $^\pi$x-metrics, based on the parity-check polynomial h(x) and the code length n received from the input unit 2

The manner in which the information exchange control unit 5 exchanges the metrics can be more easily understood if represented by an extended parity-check matrix $H_e$ of the cyclic code C and the associated Tanner graph. The parity-check matrix that represents the operations of the information exchange control unit 5 is produced by extending the parity-check matrix H of the cyclic (n,k) code C by k rows to produce an n-by-n matrix over GF(q), referred to as the extended parity-check matrix $H_e$, hereinafter.

As an example, the extended parity-check matrix $H_e$ for the binary cyclic (7,4) Hamming code is indicated in the following equation:

$$H_e = \begin{pmatrix} 1 & 1 & 1 & 0 & 1 & 0 & 0 \\ 0 & 1 & 1 & 1 & 0 & 1 & 0 \\ 0 & 0 & 1 & 1 & 1 & 0 & 1 \\ 1 & 0 & 0 & 1 & 1 & 1 & 0 \\ 0 & 1 & 0 & 0 & 1 & 1 & 1 \\ 1 & 0 & 1 & 0 & 0 & 1 & 1 \\ 1 & 1 & 0 & 1 & 0 & 0 & 1 \end{pmatrix} \quad (3)$$

As can be seen, the entries of each additional row are the coefficient of the following cyclic shifts of the parity-check polynomial:

$x^{n-k}h(x), x^{n-k+1}h(x), \ldots, x^{n-1}h(x)$. The n rows of extended parity-check matrix $H_e$ have as entries the coefficients of all the n distinct cyclic shifts of h(x) modulo $(x^n-1)$. Said differently, the rows of the extended parity-check matrix $H_e$ are produced from successive cyclic shifts $x^i h(x)$, wherein i represents individual positions in a code word.

Figure 2:
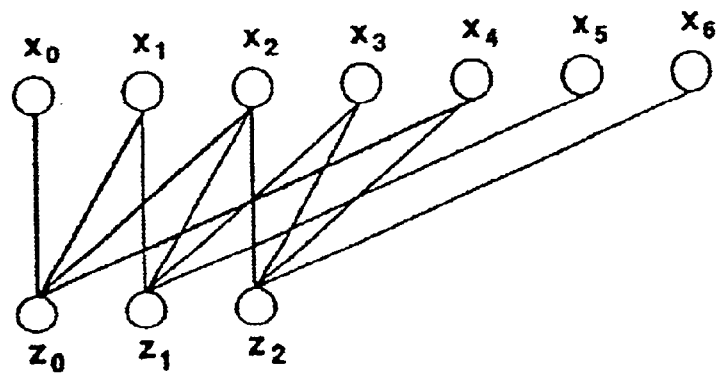
FIG. 2 is the Tanner graph of the binary cyclic (7,4) code.

Tanner graphs and their association with parity check matrices are well known in the art and are described in detail in U.S. Pat. No. 4,295,218, incorporated herein by reference. A Tanner graph is a bipartite graph with a set of code nodes that represent codeword positions, and a set of check nodes that represent parity-check equations. Code nodes are connected to a check node if and only if they participate in the same parity-check equation. Connections between code nodes and check nodes are determined by locations of nonzero entries in the parity-check matrix of the code. For example, the Tanner graph of the binary cyclic (7,4) code is shown in FIG. 2. Connections between code nodes $X_0$ to $X_6$ and check nodes $Z_0$ to $Z_2$ are determined by positions of nonzero coefficients (ones) in the parity-check matrix H shown in equation (2).

Figure 3:
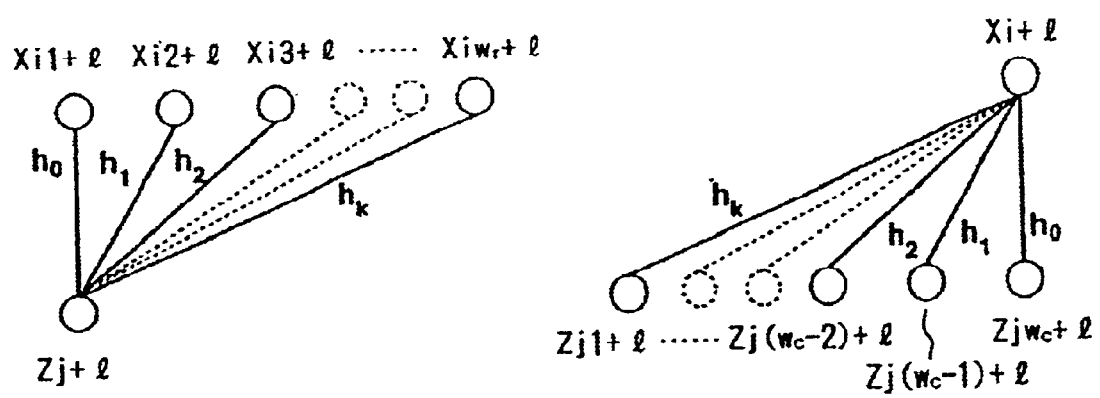
FIG. 3(a) is a schematic view showing connections between a generic check node and its parent code nodes in the Tanner graph associated with an extended parity-check matrix $H_e$.
FIG. 3(b) is a schematic view showing connections between a generic code node and its children check nodes in the Tanner graph associated with the extended parity-check matrix $H_e$.
Figure 4:
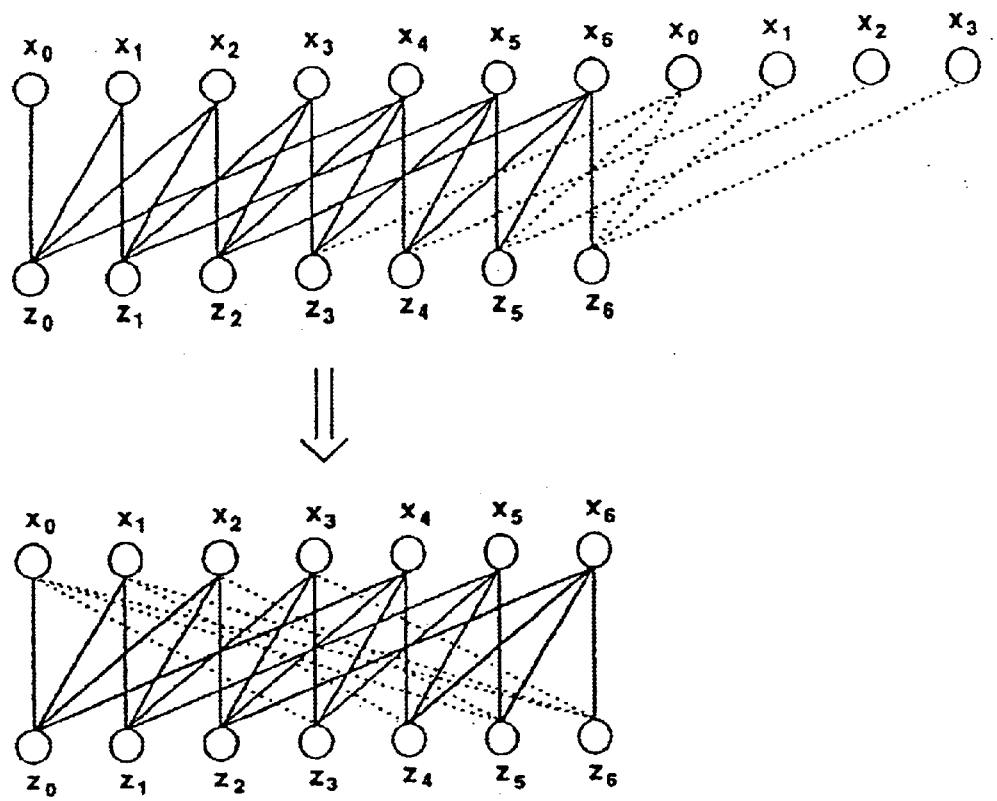
FIG. 4 shows the Tanner graph associated with the extended parity-check matrix $H_e$ for the binary cyclic (7,4) Hamming code.

The Tanner graph associated with the extended parity-check matrix $H_e$ will be described while referring to FIGS. 3(a), 3(b), and 4. FIG. 3(a) shows connections between a generic check node and its parent code nodes, and FIG. 3(b) shows connections between a generic code node and its children check nodes, in the Tanner graph associated with the extended parity-check matrix $H_e$ of a cyclic code (0≦m≦n), wherein the labels are modulo n. FIG. 4 shows the Tanner graph associated with the extended parity-check matrix $H_e$ shown in equation (3) for the binary cyclic (7,4) Hamming code.

The connections between a particular check node $z_j$ (j=0, 1, ..., n−1) and its parent code nodes $x_{i1}, x_{i2}, \ldots, x_{iw_r}$ in the Tanner graph associated with the extended parity-check matrix $H_e$ are denoted by $z_j \rightarrow \{x_{i1}, x_{i2}, \Lambda, x_{iw_r}\}$. It follows from the cyclic structure of the extended parity-check matrix $H_e$ that the connections for the next check node $Z_{j+1}$ are denoted as $z_{j+1} \rightarrow \{x_{i1+1}, x_{i2+1}, \Lambda, x_{iw_r+1}\}$, where the labels are taken modulo n. Consequently, as shown in FIG. 3(a), generic connections between any check node $Z_{j+\lambda}$ and its parent code nodes can be denoted by:

$$z_{j+\lambda} \rightarrow \{x_{i1+\lambda}, x_{i2+\lambda}, \Lambda, x_{iw_r+\lambda}\}, \text{ for } 0 \leq \lambda < n.$$

These connections between any check node (j) and its parent code nodes can be specified by the nonzero coefficients of the parity-check polynomial $x^j h(x)$. Said differently, the connections from all check nodes to all code nodes are specified by the nonzero coefficients in the n-number of cyclic shifts of the parity-check polynomial h(x).

Similarly, connections between a particular code node $x_i$ and its children check nodes $z_{j1}, z_{j2}, \ldots, z_{jw_c}$ are denoted by $x_i \rightarrow \{z_{j1}, z_{j2}, \Lambda, z_{jw_c}\}$. As shown in FIG. 3(b), connections between any code node $X_{i+\lambda}$ and its children check nodes are generically denoted by:

$$x_{i+\lambda} \rightarrow \{z_{j1+\lambda}, x_{j2+\lambda}, \Lambda, z_{jw_c+\lambda}\}, \text{ for } 0 \leq \lambda < n.$$

This is because the extended parity-check matrix $H_e$ has the special property that all the entries are the coefficients of all distinct cyclic shifts, that is, n-number of cyclic shifts, of the parity-check polynomial h(x) in reverse order. Therefore, connections from any code node (i) to its children check nodes can be specified by the nonzero coefficients of the parity-check polynomial $x^{i+n-1} h(x^{-1})$. Said differently, connections from all code nodes and check nodes can be specified by the nonzero coefficients of the n-number of cyclic shifts of the polynomial $x^{n-1} h(x^{-1})$.

The information exchange control unit 5 exchanges $^\pi$z-, $^\pi$x-, $^\lambda$z-, and $^\lambda$x-metrics between the X-processor 4 and the Z processor 6, in the manner described for exchanging information between code nodes and check nodes of the Tanner graph associated with the extended parity-check matrix $H_e$, wherein the X-processor 4 functions as the code nodes and the Z processor 6 functions as the check nodes. That is, the information exchange control unit 5 takes the πx-metrics that were calculated by the X processor 4 for nonzero elements $x_{i1+\lambda}, x_{i2+\lambda}, \ldots, x_{iw_r+\lambda}$ in each shiftλ:0≦λ≦n−1 of the n-cyclic shifts of the parity-check polynomial h(x), and distributes them to the Z processor 6 as the πz-metrics for a corresponding check node $z_{j+\lambda}$. The information exchange control unit 5 takes the λz-metrics that were calculated by the z processor 6 for nonzero elements $z_{j1+\lambda}, z_{j2+\lambda}, \ldots, z_{jw_c+\lambda}$ in each shift λ:0≦λ≦n−1 of n-cyclic shifts in a reverse order of the parity-check polynomial h(x), and distributes them to the X processor 4 as λx-metrics for the corresponding code node $x_{i+\lambda}$.

The information exchange control unit 5 determines the n-cyclic shifts of the parity-check polynomial h(x) by multiplying successive ones of $x^0$ to $x^{n-1}$ times the parity-check polynomial h(x) and determines the n-cyclic shifts in the reverse order of the parity-check polynomial h(x) by multiplying successive ones of $x^0$ to $x^{n-1}$ times the reciprocal $h^{-1}(x)$ ($x^n$ $h(x^{-1})$) of the parity-check polynomial h(x).

As noted previously, the (n-k)-by-n parity-check matrix of an (n,k) binary cyclic code has columns with very low Hamming weights, that is, with only one nonzero element. For example, the first and last two columns of the parity-check matrix H of the equation (2) have only one nonzero entry. This means that iterative decoding based on belief propagation will not work on the associated Tanner graph.

However, because the extended parity-check matrix $H_e$ is produced by extending the parity-check matrix H by k rows, the Hamming weight of the columns is increased. That is, the extended parity-check matrix $H_e$ of a cyclic code C has Hamming weights $w_c$ in each column, and Hamming weights $w_r$ in each row, that are equal to the Hamming weight $w_h$ of the parity-check polynomial h(x) where: $w_h = |\{i; h_i \neq 0, 0 \leq i \leq k\}|$, $|S|$=the number of elements in a set S. For example, the extended parity-check matrix $H_e$ of equation 3 for the cyclic (7,4) Hamming code has Hamming weights $w_r = w_c = w_h = 4$.

Increasing the weight of the columns in this way means that code symbols are involved in more check equations, so that iterative decoding based on belief propagation will perform better.

Moreover, the additional k rows of the extended parity-check matrix $H_e$ are linearly dependent on the first n-k rows, so that the dimension of the code remains the same. That is, the Hamming weight of the columns is increased without increasing the density of the parity-check matrix. The density of a parity-check matrix is the number of nonzero entries divided by the total number of entries, and it is known that codes with low density parity-check matrices perform better in iterative decoding based on belief propagation. Because the column weights are increased without increasing the density, iterative decoding based on belief propagation will perform better on the Tanner graph associated with the extended parity-check matrix $H_e$ than that associated with the parity-check matrix H.

Here, operation of the decoder 1 will be described in more detail. First, for $i \in \{0, 1, \ldots, n-1\}$ and $j \in \{0, 1, \ldots, J-1\}$, the information exchange control unit 5 initializes metrics $\pi_x(i,j)$ to the LLR(i) values from the scaler 3, and metrics $\lambda_z(i,j)$ to zero. Then, for $i \in \{0, 1, \ldots, n-1\}$, the information exchange control unit 5 initializes index sets $I_x(i)$, $I_z(i)$, which are used to determine destination nodes during information exchange, to zero.

Next, for $i \in \{0, 1, \ldots, n-1\}$, the information exchange control unit 5 propagates the metrics in the following manner. Although not shown in FIG. 1, the information exchange control unit 5 includes a check node memory for holding $\pi$-metrics and a code node memory for holding $\lambda$-metrics.

For X (code node)-to-Z (check node) propagation, for $j \in \{0, 1, \ldots, J-1\}$ the information exchange control unit 5 loads $\pi$-metrics in the check node memory: $\pi_z(Px(i,j)), I_x(Px(i,j))) = \pi_x(i,j)$, $I_x(Px(i,j)) = I_x(Px(i,j)) + 1$, wherein Px(i,j) is an integer representing a link from code node $x_i$ to check node Pz(i,j).

Px(i,j) represents the i-th cyclic shift (to the right) of the parity-check polynomial h(x). The value of j serves to index the nonzero coefficients of the parity-check polynomial, which in turn determine the connections between a code node i and a check node. There are J-number of check nodes connected to each code node, and consequently the value of j ranges from 0 to J-1. Also, equivalently, in terms of the extended parity-check matrix $H_e$, i is the row index and j is an index to the j-th nonzero element in that row. For each code node i, the value of Px(i,j) ranges from 0 to n-1, and value of Px(i,j) is used to point to check nodes.

For Z (check node)-to Y (code node) propagation, for $j \in \{0, 1, \ldots, J-1\}$ the information exchange control unit 5 loads $\lambda$-metrics in the code node memory: $\lambda_x(Pz(i,j)), Iz(Pz(i,j))) = \lambda_z(i,j)$, $I_z(Pz(i,j)) = I_z(Pz(i,j)) + 1$, wherein Pz(i,j) is an integer representing a link from check node $z_i$ to code node Pz(i,j).

The value Pz(i,j) is defined similarly to the value Px(i,j). The value Pz(i,j) functions to determine connections between a check node i and the J code nodes it is connected to. In terms of the extended parity-check matrix $H_e$, i is the column index and j is the index of the j-th nonzero element.

As a result, the Z processor 6 receives n-sets of metrics $\pi z(i,j)$ (where $0 \leq j \leq J-1$), each set including J-number of metrics $\pi z(i,j)$ (that is $\overline{\pi}_z(i) \underline{\Delta} (\pi_z(i,0), \ldots, \pi_z(i,J-1))$), from the information exchange control unit 5. The Z processor 6 calculates n-sets of metrics $\lambda z(i,j)$, each set including J-number of metrics $\lambda z(i,j)$ (that is, $\overline{\lambda}_z(i) \underline{\Delta} (\lambda_z(i,0), \ldots, \lambda_z(i, J-1)$), based on the metrics $\pi z(i,j)$.

The Z processor 6 computes for $i \in \{0, 1, \ldots, n-1\}$ the metrics $\lambda z(i,j)$ based on the following formula:

$$\lambda_z(i,j) = (-1)^{\delta \oplus sgn(\pi_z(i,j))}(S - F_Q(|\pi_z(i,j)|)) \quad (4)$$

wherein:

sgn(x)=1 if x<0, and equals 0 if $x \geq 0$;

|x| denotes the absolute value (or magnitude) of x;

$$S = (-1)^\delta \sum_{j=0}^{J-1} F_Q(|\pi_z(i,j)|), \quad (5)$$

$\delta = (-1)^{\oplus_{j=0}^{J-1} sgn(\pi_z(i,j))}$, and $F_Q(x)$ denotes a quantized version of the function $F(x) = \log[(e^x+1)/(e^x-1)]$.

Figure 5:
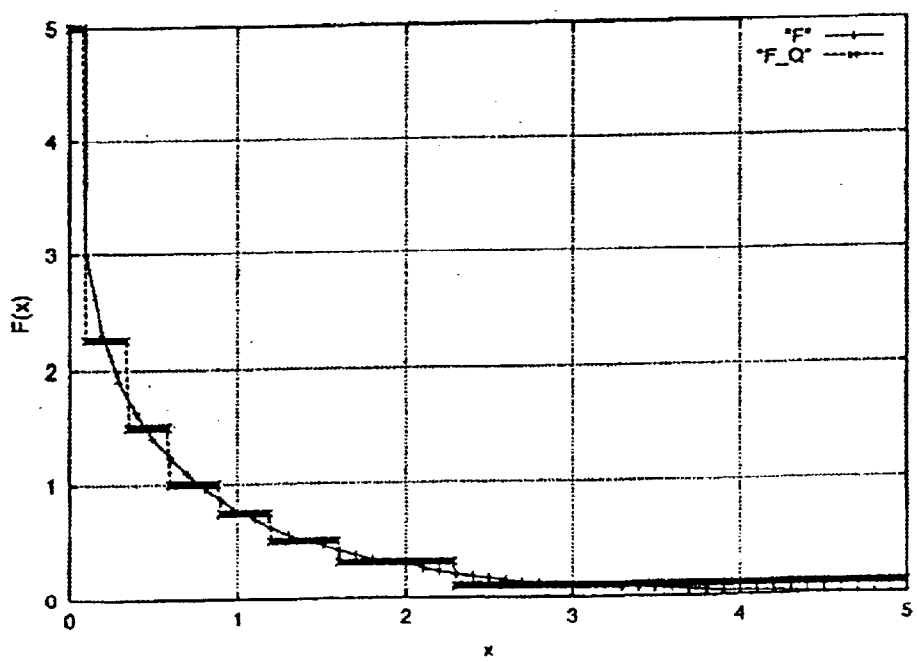
FIG. 5 is a graph comparing a function F(x) with z quantized version FQ (x)

The decoder 1 can achieve practically the same error performance as with no quantization, much more easily when the Z processor 6 computes the metrics $\lambda z(i,j)$ using the quantized version $F_Q(x)$ indicated below. FIG. 5 shows the function F(x) in comparison with the quantized version $F_Q(x)$:

$$F_Q(x) = \begin{cases} 5.00, & 0 \leq x \leq 0.10; \\ 2.25, & 0.10 \leq x \leq 0.35; \\ 1.50, & 0.35 \leq x \leq 0.60; \\ 1.00, & 0.60 \leq x \leq 0.90; \\ 0.75, & 0.90 \leq x \leq 1.20; \\ 0.50, & 1.20 \leq x \leq 1.60; \\ 0.30, & 1.60 \leq x \leq 2.30 \\ 0.10, & 2.30 \leq x. \end{cases}$$

The X processor 4 receives the log-likelihood ratios LLR(i) from the scaler 3, and uses them and $\lambda x(i,j)$ metrics (wherein $\overline{\lambda}_x(i) \underline{\Delta} (\lambda_x(i,0), \ldots, \lambda_x(i,J-1))$) from the information exchange control unit 5 to compute, for $i \in \{0, 1, \ldots, n-1\}$, metrics $\pi x(i,j)$ (wherein $\overline{\pi}_x(i) \underline{\Delta} (\pi_x(i,0), \ldots, \pi_x(i,J'1))$) and the n-number of estimated code bits $\exists_i$. The X processor determines the n-number of estimated code bits $\exists_i$ after the fixed number of iterations received from the input unit 2.

Figure 6:
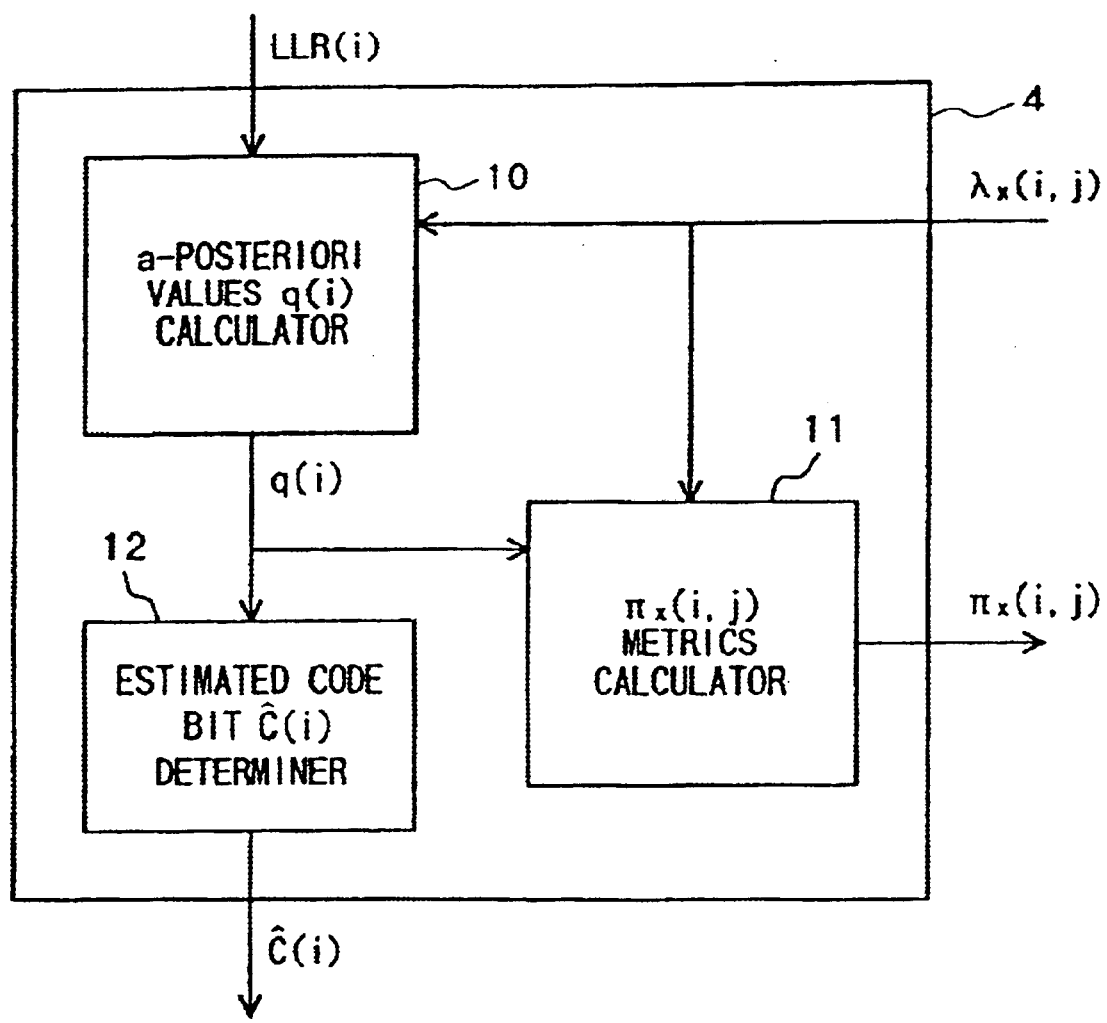
FIG. 6 is a block diagram showing components of an X processor of the decoder shown in FIG. 1.

As shown in FIG. 6, the X processor 4 includes an a-posteriori values q (i) calculator 10, a metrics πx(i,j) calculator 11, and an estimated code bit $\unicode{x2284}_i$ determiner 12. The a-posteriori values q (i) calculator 10 receives n-sets of metrics λx(i,j), each set including J-number of metrics λx(i,j), from the information exchange control unit 5, and calculates n-number of a-posteriori values q(i), which are the posteriori log-likelihood ratio of a code symbol ("soft output"). The a-posteriori values q (i) calculator 10 calculates the a-posteriori values q(i) based on the metrics λx(i,j) and the log-likelihood ratios LLR(i) from the scaler 3, as represented by the following formula:

$$q(i) = \sum_{j=0}^{J-1} \lambda_x(i, j) + LLR(i) \tag{6}$$

The πx(i,j) metrics calculator 11 calculates n-sets of metrics πx(i,j), each set including J-number of metrics πx(i,j), based on the metrics λx(i,j) and the a-posteriori values q(i). In particular, the πx(i,j) metrics calculator 11 calculates the metrics πx(i,j) based on the following formula:

$$\pi_x(i,j) = q(i) - \lambda_x(i,j) \tag{7}$$

The X and Y processors 4, 6 calculate the metrics, and the information exchange control unit 5 distributes the metrics, for the fixed number of iterations $N_{iter}$. Because the number of iterations is fixed, decoding delay is constant. This facilitates hardware implementation, because no buffers are needed when data is delivered to the destination (or to the source decoder) at a constant rate. Alternatively, iterations can be stopped when a maximum number of iterations is reached, instead of according to an input fixed number. However, in this case, the decoding delay is variable and also a set of stopping rules are needed.

Once the number of iterations have been performed, for i ∈ {0, 1, . . . , n−1} the estimated code bit $\unicode{x2284}_i$ determiner 12 determines n-number of estimated code bits $\unicode{x2284}_i$ based on the a-posteriori values q(i) from the a-posteriori values q (i) calculator 10. In particular, the estimated code bit $\unicode{x2284}_i$ determiner 12 determines the n-number of estimated code bits as the sign bit of the LLRs based on the following formula:

$$\unicode{x2284}_i = sgn(q(i)) \tag{8}$$

Figure 7:
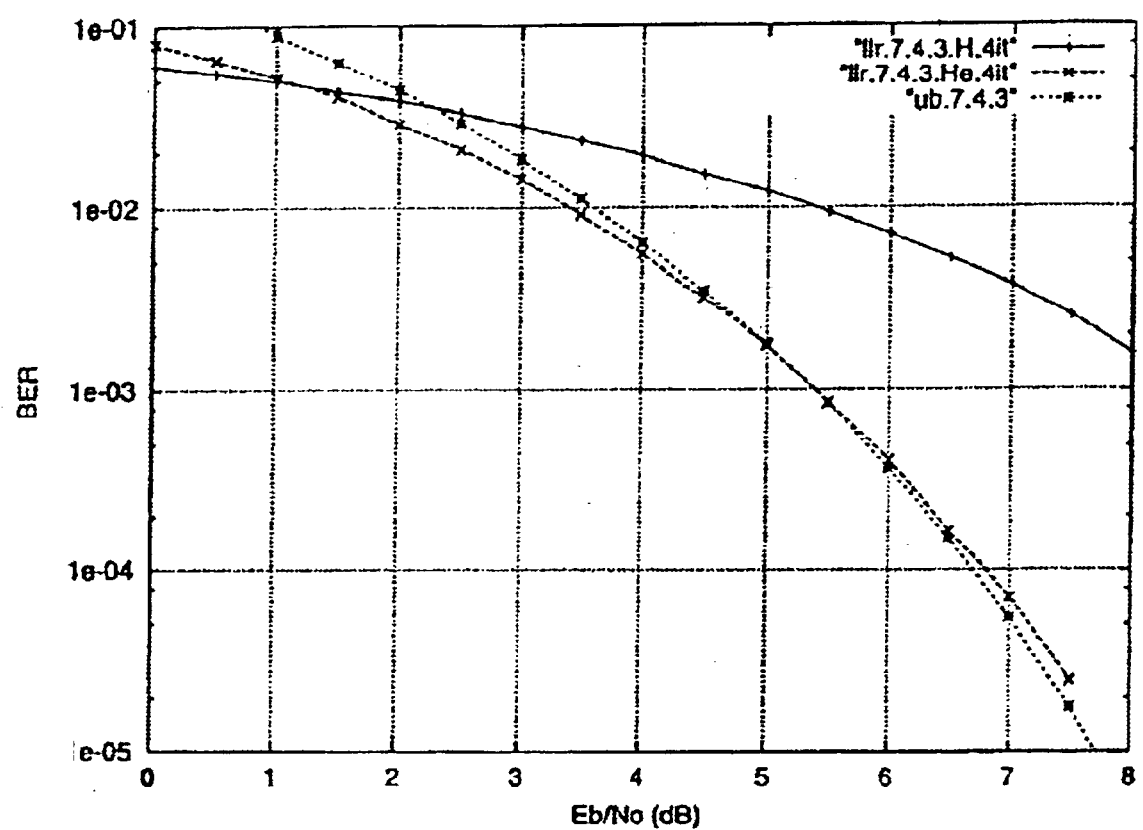
FIG. 7 is a graph showing simulation results of iterative decoding of the (7,4) Hamming code, with 4 iterations, when decoding is performed according to the present invention.

FIG. 7 shows simulation results of iterative decoding of the (7,4) Hamming code, with 4 iterations, when decoding is performed in the manner of the decoder 1, indicated as $H_e$, compared to decoding performed in the manner represented by the Tanner graphs associated with the parity-check matrix H. As a reference, FIG. 7 also shows the union bound (UB) on the bit error rate of this code with maximum-likelihood decoding (MLD).

Figure 8:
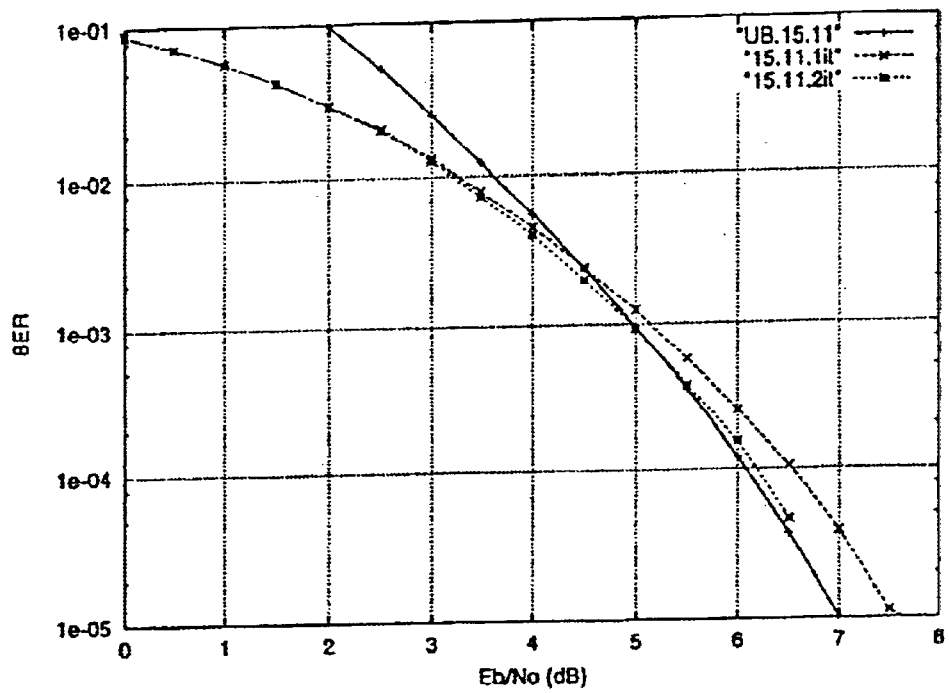
FIG. 8 is a graph showing simulation results for when a binary BCH (15,11) code is decoded according to the present invention.
Figure 9:
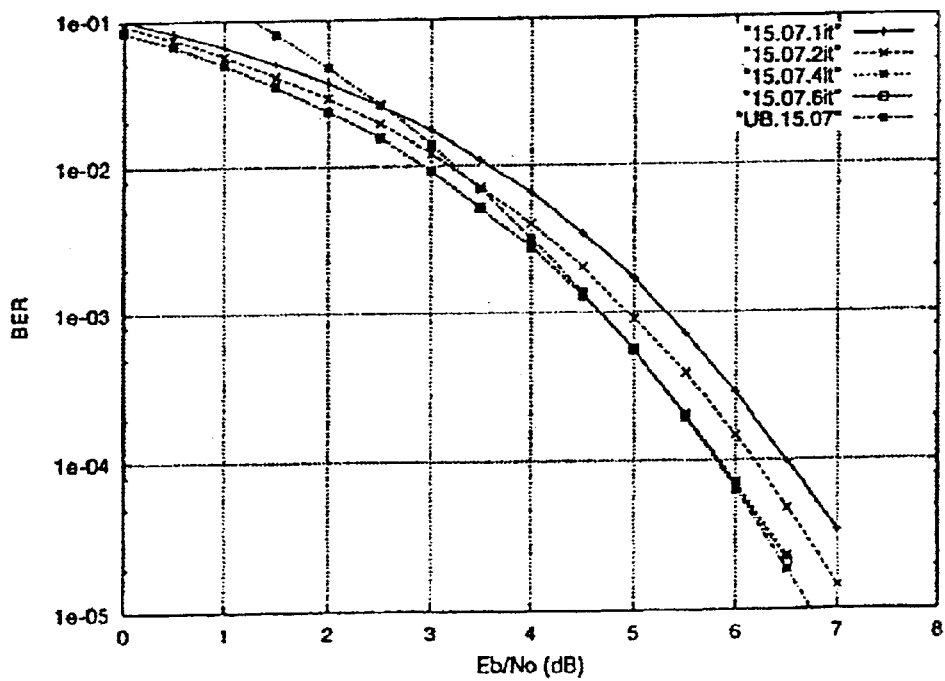
FIG. 9 is a graph showing simulation results for when a binary BCH (15,7,5) code is decoded according to the present invention.
Figure 10:
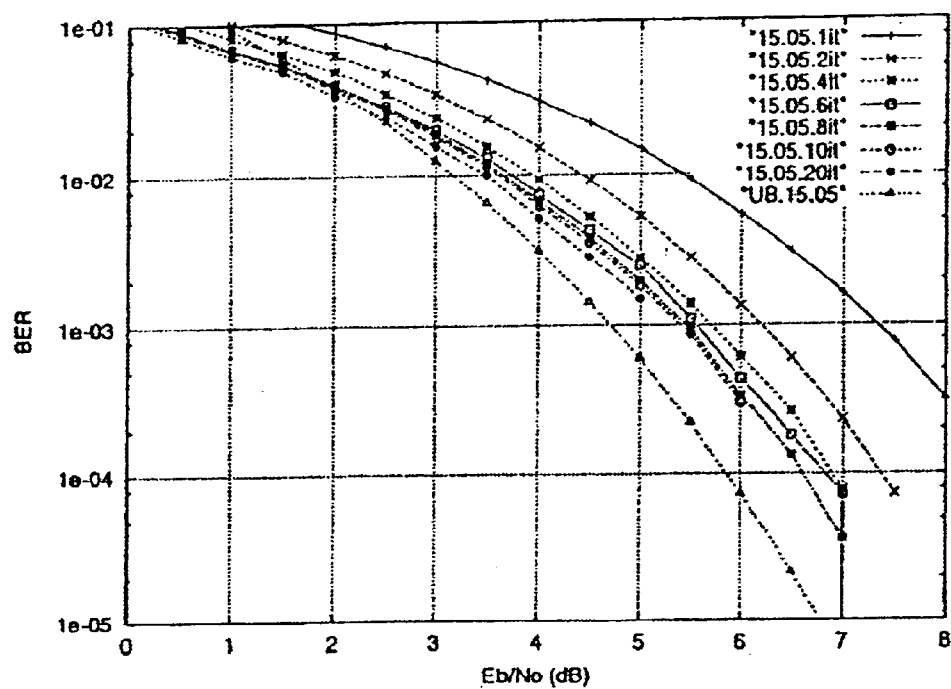
FIG. 10 is a graph showing simulation results for when a binary BCH (15,5,7) code is decoded according to the present invention.

FIGS. 8 to 10 show results of computer simulations of decoding binary cyclic codes in the manner of the decoder 1. In all cases, metrics were distributed based on the cyclic shift, and the reverse order of the cyclic shift, of the parity-check polynomial. Iterative decoding based on Pearl's algorithm, using log-likelihood ratios and floating-point precision, was implemented as a C program.

FIG. 8 shows simulation results for the binary BCH (15,11) code, FIG. 9 shows simulation results for the binary BCH (15,7,5) code, and FIG. 10 shows simulation results for the binary BCH (15,5,7) code. As a reference, the union bounds on the bit error rate achieved by maximum-likelihood decoding (MLD), based on the weight distributions of the codes, are also shown for these codes.

Figure 11:
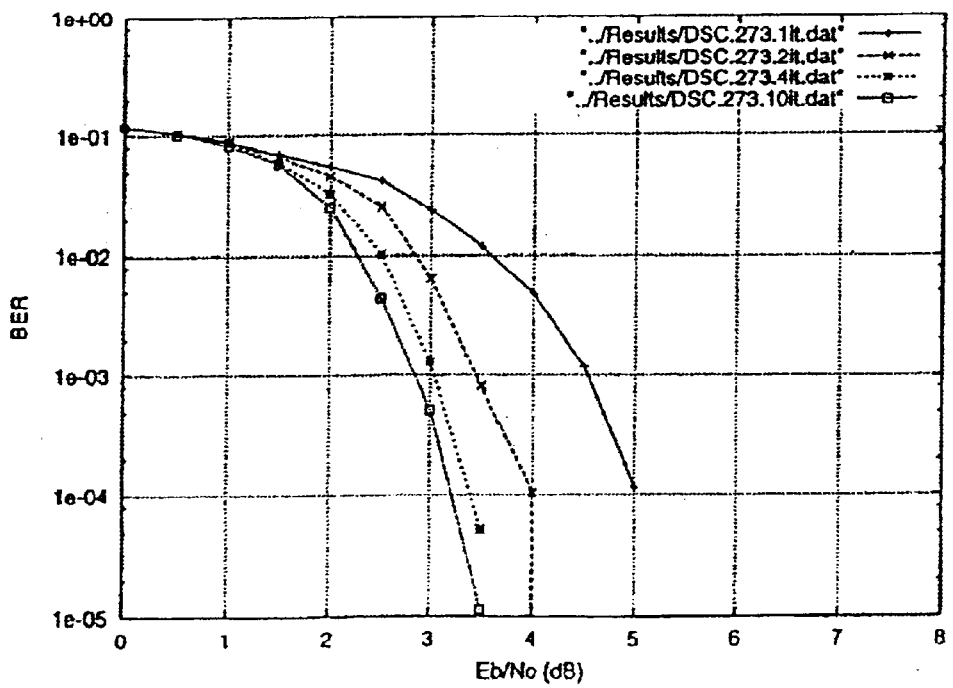
FIG. 11 is a graph showing simulation results for when a binary (273,191) difference-set (DS) code is decoded according to the present invention.

FIG. 11 shows simulation results of iterative decoding of the binary (273,191) difference-set (DS) code. This is a binary projective geometry (PG) code introduced by Kou et al in a presentation entitled Low density parity Check Codes Based on Finite Geometries: A Rediscovery and More, presented at the AECC-13 Conference, Honolulu, Hi., November 1999. The binary (273,191) difference-set (DS) code has unknown weight distribution and thus no union bound is plotted in FIG. 11.

By comparing the results of FIGS. 8 to 11, it can be seen that the iterative procedure for the BCH (15,5,7) code of FIG. 10 converges very slowly. Extensive simulations of other cyclic codes revealed iterative decoding converges to maximum-likelihood decoding very fast, that is, in a few iterations, for high rate codes, but in many cases very slowly for medium to low rate codes.

Figure 12:
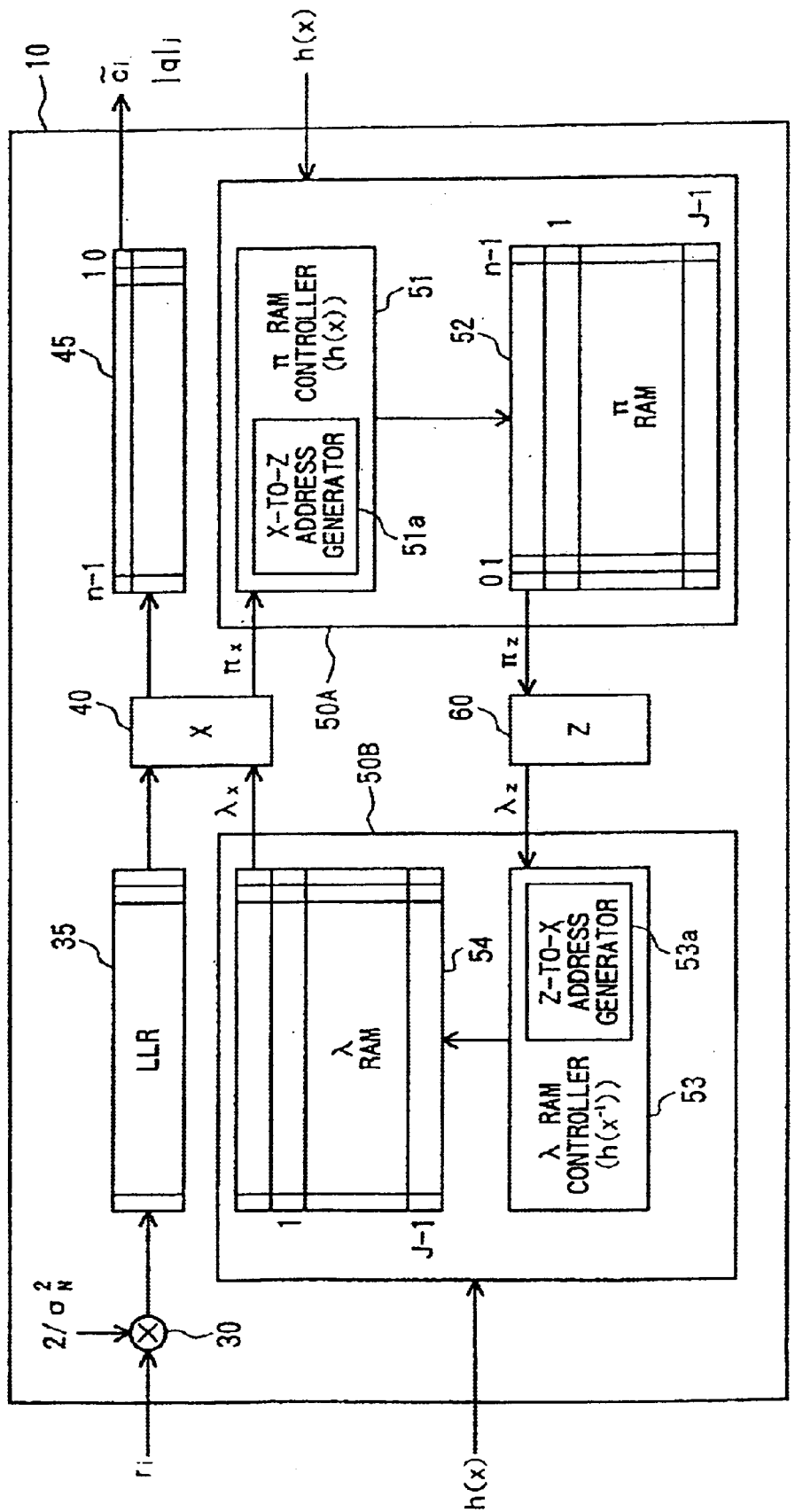
FIG. 12 is a block diagram showing a serial decoder according to a first example of the embodiment.
Figure 13:
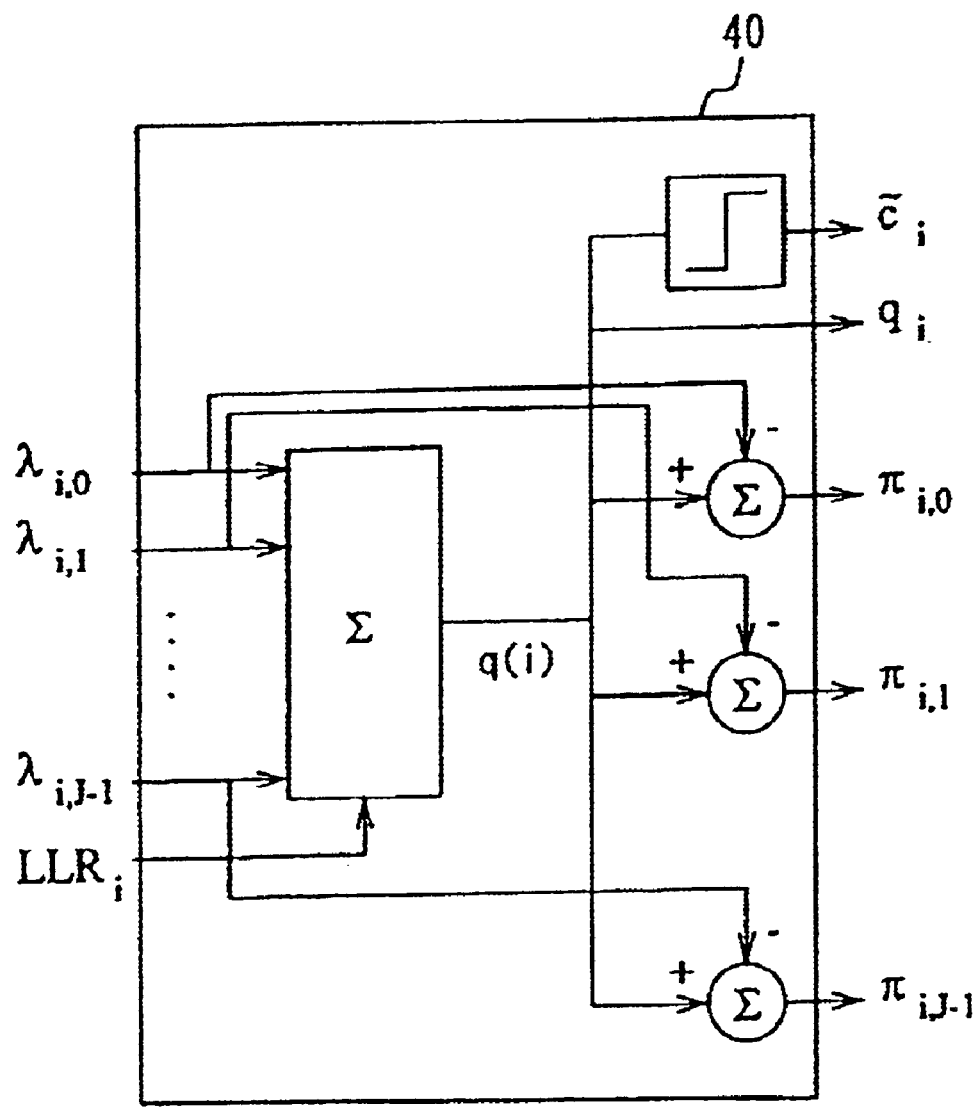
FIG. 13 is a block diagram showing an X processor of the serial decoder of FIG. 12.
Figure 14:
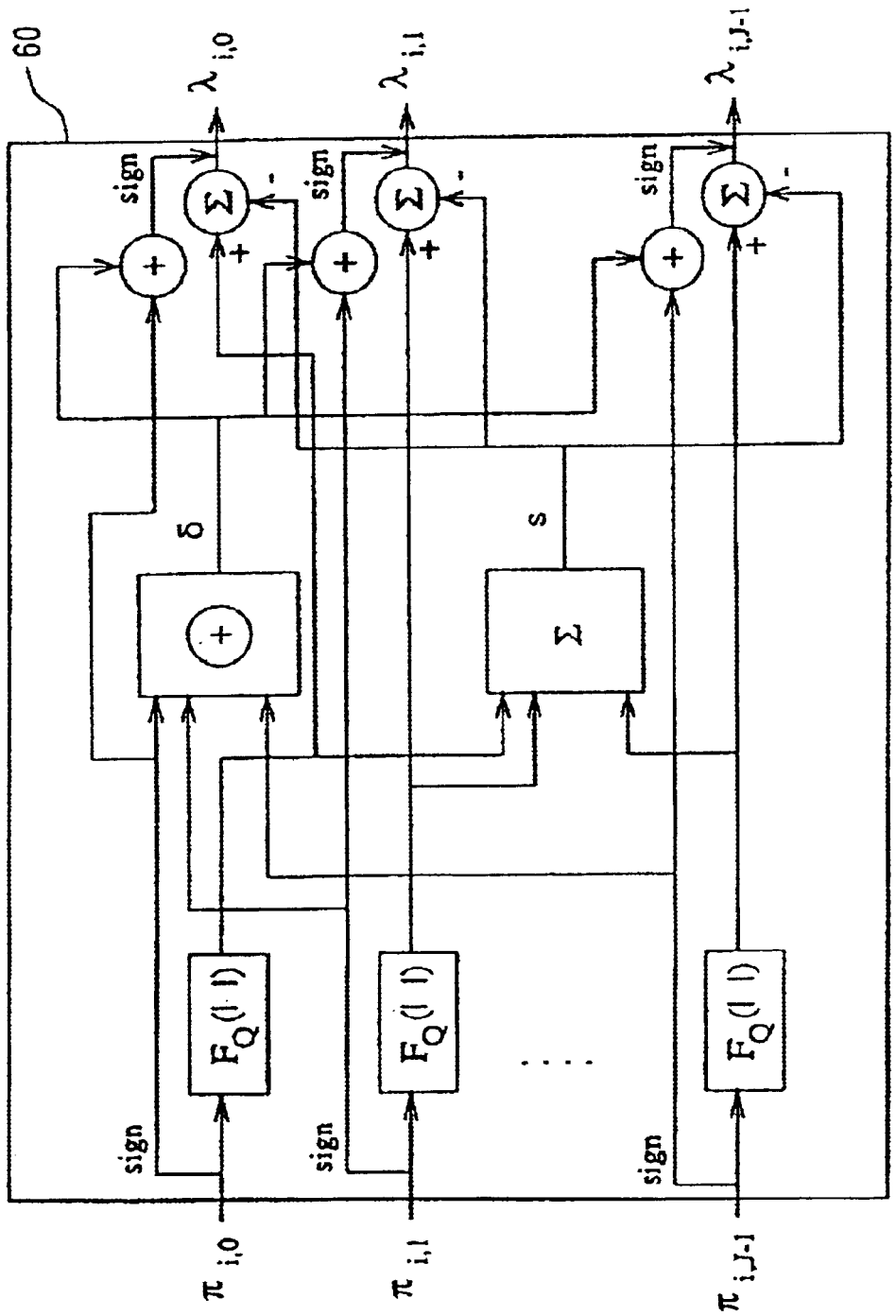
FIG. 14 is a block diagram showing an Z processor of the serial decoder of FIG. 12.
Figure 15:
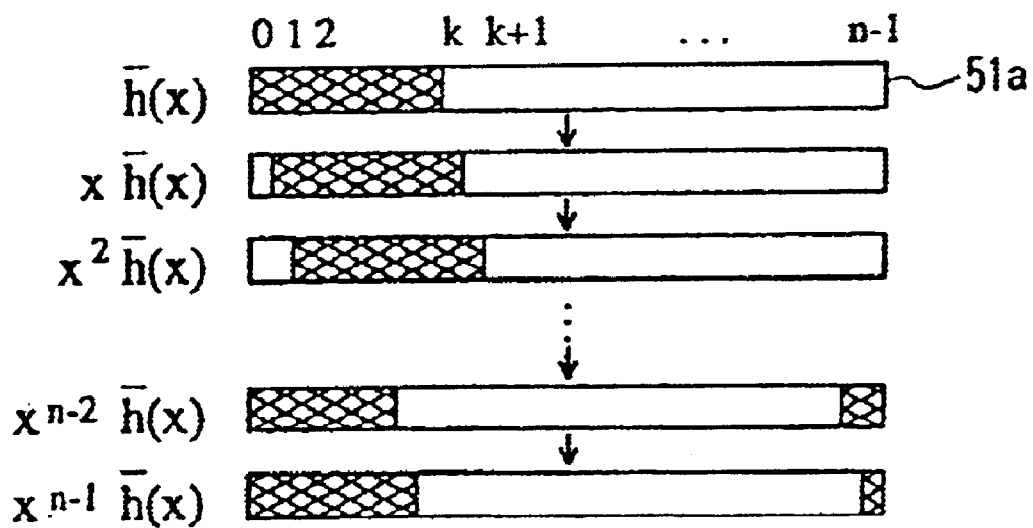
FIG. 15(a) is a schematic view representing address generation in an X-to-Z address generator of an X-to-Z propagation unit of the serial decoder shown in FIG. 12.
FIG. 15(b) is a schematic view representing address generation in a Z-to-X address generator of a Z-to-X propagation unit of the serial decoder shown in FIG. 12.
Figure 15:
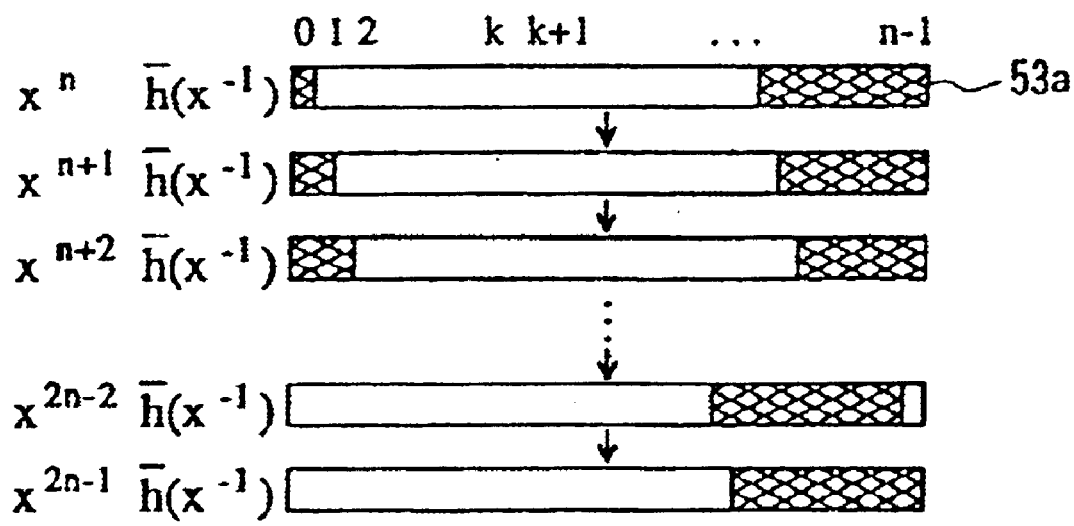

Next, example configurations for the iterative decoder 1 based on belief propagation according to the embodiment will be described while referring to FIGS. 12 to 18. FIG. 12 shows a serial decoder 10 according to a first example of the embodiment. The decoder 10 includes a scaler 30, an LLR buffer 35, an X processor 40, a buffer 45, an X-to-Z propagation unit 50A, a Z processor 60, and a Z-to-X propagation unit 50B. FIG. 13 shows details of the configuration of the X processor 40, and FIG. 14 shows details of the configuration of the Z processor 60.

The X-to-Z propagation unit 50A includes a π RAM controller 51 and a π RAM 52. The π RAM controller 51 includes an X-to-Z address generator 51a. According to the present embodiment, the X-to-Z address generator 51a is a circular buffer as shown in FIG. 15(a).

The Z-to-X propagation unit 50B includes λ RAM controller 53 and a λ RAM 54. The λ RAM controller 53 includes a Z-to-X address generator 53a. According to the present embodiment, the Z-to-X address generator 53a is a circular buffer as shown in FIG. 15(b).

Next, an example will be provided for operations in the serial decoder 10. In this example, the decoder 10 receives, from across a noisy channel, a data stream encoded according to the binary cyclic (7,4) Hamming code, that is, encoded using the parity-check matrix H. Accordingly, the decoder 10 receives a vector of the noisy received values r0 . . . r6, and input of code length 7 and of the parity-check polynomial $h(x)=1+x+x^2+x^4$. The noisy received values r0 . . . r6 are input to the scaler 30, the parity-check polynomial $h(x)=1+x+x^2+x^4$ is input to the X-to-Z propagation unit 50A and the Z-to-X propagation unit 50B, and the code length 7 is input to all components.

During initialization the π RAM 52 and the λ RAM 54 are organized into a 4-by-7 array by the π RAM controller 51 and the λ RAM controller 53, respectively, because the parity-check polynomial h(x) has four (J=4) non-zero coefficients and because the code length is seven (n=7).

The scaler 30 multiplies each noisy received value r0 . . . r6 by the constant 4/No ($=2/\sigma^2$), thereby obtaining log-likelihood ratios LLR(0)–LLR(6) (LLR(i), where i=0, . . . 6). The log-likelihood ratios LLR(0)–LLR(6) are stored in the LLR buffer 35.

Next, all the metrics πx(i,j) in the π RAM controller 51 are initialized to LLR(i). For example, when i=0, the four metrics πx(0,j: where j=0–3) are initialized to LLR(0). All the metrics λz(i,j) (where i=0–7, j=0–3) in the λ RAM controller 53 are initialized to zero.

After initialization, as shown at the top of FIG. 15(a), the X-to-Z address generator 51a of the π RAM controller 51 generates addresses for the π RAM 52 that correspond to the parity-check polynomial $h(x)=1+x+x^2+x^4$. The π RAM controller 51 distributes the metrics πx(0,j)–πx(6,j) (that is, LLR(0)–LLR(6)) in the π RAM 52 according to these addresses. That is, the first column (i=0) of the π RAM 52 corresponds to the parity-check polynomial $h(x)=1+x+x^2+x^4$, and therefore to the first row of the extended parity-check matrix $H_e$ of equation (3). Non-zero coefficients appear in the positions of i=0, 1, 2, and 4 in the first row of the extended parity-check matrix $H_e$ of equation (3). Accordingly, the π RAM controller 51 stores metrics πx(0, 0), πx(1,0), πx(2,0), πx(4,0) in this order in the first column of the π RAM 52, in association with indexes I of 0–3, respectively.

Next, as shown in the second portion of FIG. 15(a), the X-to-Z address generator 51a generates addresses for the π RAM 52 that correspond to the parity-check polynomial xh(x), because the second column (i=1) of the π RAM 52 corresponds to the parity-check polynomial xh(x), which is represented by the second row of the extended parity-check matrix $H_e$ of equation (3). Non-zero coefficients appear in the positions of i=1, 2, 3, and 5 in the second row of extended parity-check matrix $H_e$ of equation (3). That is, the positions of the non-zero coefficients are cyclically shifted from the positions for the first row. Accordingly, the π RAM controller 51 stores the metrics πx(1,1), πx(2,1), πx(3,0), πx(5,0) in this order in the second column of the π RAM 52, with the indexes I of 0–3.

While the X-to-Z address generator 51a generates address according to cyclical shifts in the parity-check polynomial h(x) as shown in FIG. 15(a), the π RAM controller 51 distributes the metrics πx(i,j) to third through sixth columns (i=2–6) of the π RAM 52 in the same manner as described above for the first and second columns. The operation of the X-to-Z address generator 51a shown in FIG. 15(a) corresponds to changes in the value Px(i,j). As a result, the 4-by-7 array of the π RAM is stored with the metrics πx(i,j) as shown in FIG. 16. The metrics πx(i,j) in the π RAM 52 are then sent to the Z processor 60 as metrics πz(i, j). Using the first column (i.e., i=0) of the π RAM 54 in FIG. 16 as an example, the metrics πx(0, 0), πx(1, 0), πx(2, 0), and πx(4, 0) are sent to the X processor 40 as metrics πz(0, 0), πz(0, 1), πz(0, 2), and πz(0, 3).

Next, the Z processor 60 uses the values (i, j) in the i-th column and on the j-th row of the π RAM 52 as π z(i,j; where i=0 to 6 and J=0 to 3) to compute λz(i,j) using the equation (4). For example, the Z processor 60 uses the four values in the first column i=0 in the π RAM 52 as πz(0, j; where j=0 to 3) to calculate λz(0, 0), λz(0, 1), λz(0, 2), and λz(0, 3).

As shown at the top of FIG. 15(b), the Z-to-X address generator 53a of the λ RAM controller 53 generates addresses for the λ RAM 54 that correspond to the parity-check polynomial $x^7h(x^{-1})$. The λ RAM controller 53 loads the λz(i, j) metrics (i=0–6, j=0–3) in the λ RAM 54 according to these addresses. That is, the first column (i=0) of the λ RAM 54 corresponds to the parity-check polynomial $x^7h(x^{-1})$ and therefore to the first column of the extended parity-check matrix $H_e$ of equation (3). Non-zero coefficients appear in the positions of i=0, 3, 5, and 6 in the first column of the extended parity-check matrix $H_e$ of equation (3). Accordingly, the λ RAM controller 53 stores the λz(0,0), λz(3,0), λz(5,0), λz(6,0) in this order in the first column of the λ RAM 54, in association with the index I of (0)–(3).

Next, as shown in the second portion of FIG. 15(b), the X-to-Z address generator 53a generates addresses for the λ RAM 54 that correspond to the parity-check polynomial $x^8h(x^{-1})$, because the second column (i=1) of the λ RAM 54 corresponds to the parity-check polynomial $x^8h(x^{-1})$, which is represented by the second column of the extended parity-check matrix $H_e$ of equation (3). Non-zero coefficients appear in the positions of i=0, 1, 4, and 6 in the second column of the extended parity-check matrix $H_e$ of equation (3). That is, the positions of the non-zero coefficients are cyclically shifted from the positions for the first column of the extended parity-check matrix $H_e$ of equation (3) Accordingly, the λ RAM controller 53 stores the λz(0,1), λz(1,0), λz(4,0), λz(6,1) in this order in the second column of the λ RAM 54, with the index I of (0)–(3).

While the Z-to-X address generator 53a generates addresses according to cyclic shifts in the parity-check polynomial $x^7h(x^{-1})$ as shown in FIG. 15(b), the λ RAM controller 53 distributes the metrics λz(i, j) to other third through sixth columns (i=2–6) of the λ RAM 54 in the same manner as described above for the first and second columns. Operation of the Z-to-X address generator 53a shown in FIG. 15(b) correspond to changes in the value Pz(i,j). As a result, the 4-by-7 array of the λ RAM 54 is stored with the metrics λz(i, j) as shown in FIG. 17. The metrics λz(i, j) in the λ RAM 54 are then sent to the X processor 40 as metrics λx(i, j). Using the first column (i.e., i=0) of the λ RAM 54 in FIG. 17 as an example, the metrics λz(0, 0), λz(3, 0), λz(5, 0), and λz(6, 0) are sent to the X processor 40 as metrics λx(0, 0), λx(0, 1), λx(0, 2), and λx(0, 3).

The decoder 10 performs second and subsequent iterative steps in the iterative process in the following manner. The X processor 40 uses the values in the i-th column and on the j-th row in the λ RAM 54 as metrics λx(i, j) where i=0–6, j=0–3 to compute a-posteriori values q(i) using the equation (6) and to compute the metrics πx(i, j) using the equation (7). For example, the X processor 40 uses the four values in the first column n=0 in the λ RAM 54 as metrics λx(0, j) where j=0–3 to compute a-posteriori value q(0) and to compute the metrics πx(0,j). The X-to-Z propagation unit 50A, the Z processor 60, and the Z-to-X propagation unit 50B all perform the same processes as described above in the first iterative step.

After iterations have been performed for the fixed number of iterations $N_{iter}$, the X processor 40 determines estimated code bits ci (i=0–6) based on equation (8) and stores them in the buffer 45 for output. The X processor 40 also stores the soft output values q(i) in the buffer 45 for output. The soft output values q(i) indicate the reliability of decoded bits. That is, the larger the magnitude of the absolute value of q(i), the more reliable the bit is. The values of q(i) are used in feeding back information to a demodulator (not shown) of the decoder.

Figure 18:
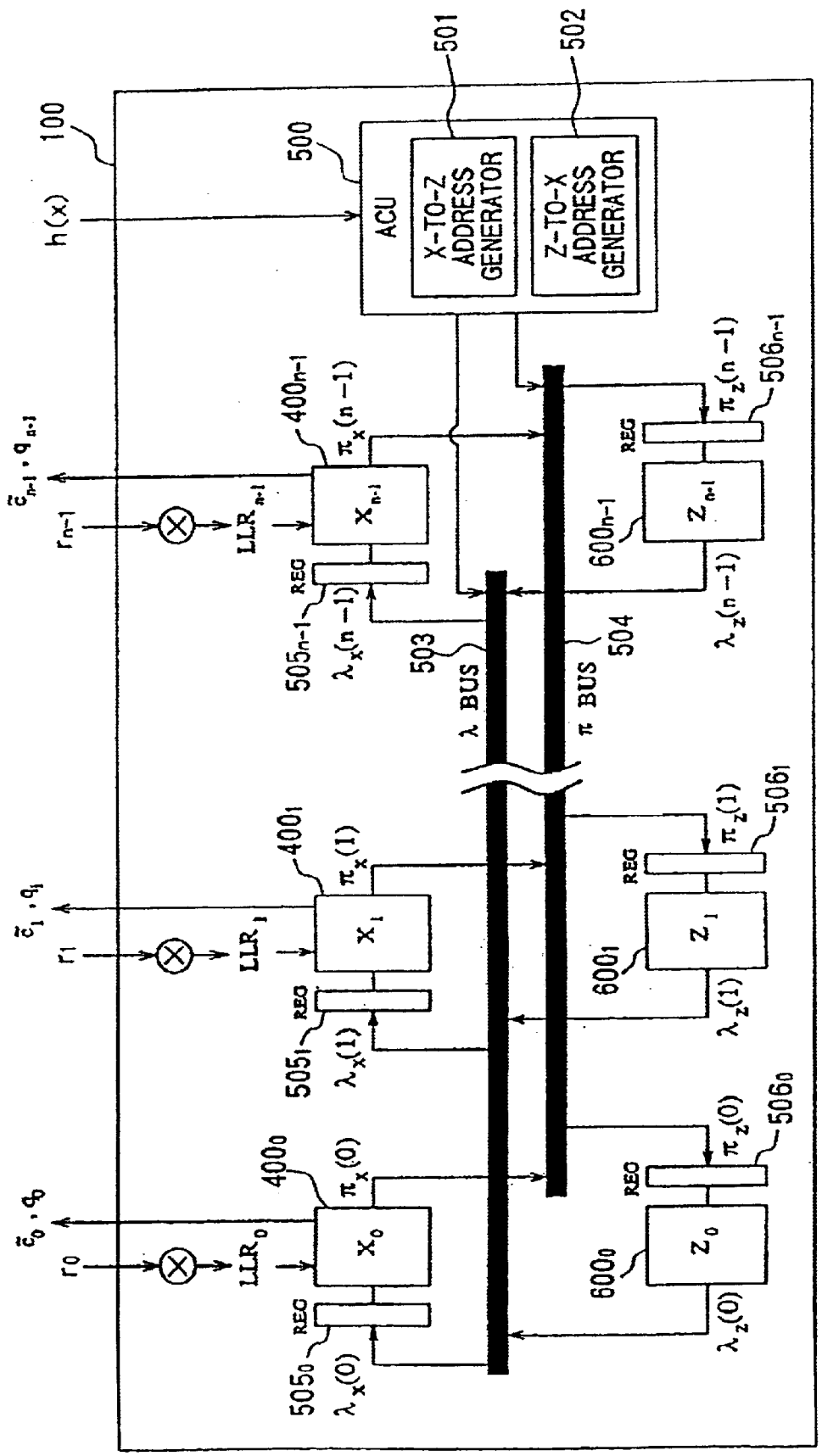
FIG. 18 is a block diagram showing a parallel decoder according to a second example of the embodiment.

FIG. 18 shows a parallel decoder 100 according to a second example of the embodiment. The decoder 100 includes n-number of X-processors $400_0$ to $400_{n-1}$, n-number of Z-processors $600_0$ to $600_{n-1}$, and an address computation unit (ACU) 500, all connected to a λ bus 503 and a π bus 504. Registers $505_0$ to $505_{n-1}$ are provided, one in connection with each of the X-processors $400_0$ to $400_{n-1}$. The registers $505_0$ to $505_{n-1}$ correspond to the different columns of the λ RAM 54 of the serial decoder 10. Similarly, registers $506_0$ to $506_{n-1}$ are provided, one in connection with each of the Z-processors $600_0$ to $600_{n-1}$. The registers $506_0$ to $506_{n-1}$, correspond to the different columns of the π RAM 52. The ACU 500 includes an X-to-Z address generator 501 and a Z-to-X address generator 502, that function basically the same as the X-to-Z address generator 51a and the Z-to-X address generator 53a, respectively, of the first example. It can be readily understood that each of the X and Z processors correspond to one of the nodes in the Tanner graph associated with the extended parity check matrix $H_e$ produced by the N-number of cyclic shifts of the inputted parity-check polynomial, with connections between the nodes determined by the ACU 500.

The serial decoder 10 requires less hardware than the parallel decoder 100, but the parallel decoder 100 is faster than the serial decoder 10. Table 1 summarizes the parameters of these two example configurations.

TABLE 1

| Example | Cycles per Iteration | Number of Processors | Number of Memory Elements |
|---|---|---|---|
| First Example (Serial) | 2n | 2 | (2n × J + 2n) × $N_q$ |
| Second Example (Parallel) | 2 | 2n | (2n × J + 2n) × $N_q$ |

In Table 1, $N_q$ denotes the number of quantization bits used for the metrics. In determining the required number of memory elements, it is assumed that all the metrics in the decoder, that is, the a-priori LLR from the channel, the a-posteriori LLR q(i), and the π and λ metrics, are represented with the same number of bits.

Next, a modification of the embodiment will be explained. According to this modification, preliminary hard decisions are made based upon the a-posteriori log-likelihood ratios q(i) of the incoming channel symbols. The hard decision values are kept fixed throughout the decoding process. This increases the throughput of the decoder, while reducing its complexity, without a significant increase in decoding errors.

Assume binary transmission over an AWGN channel. Then a received symbol is given by $r_i = \text{sgn}(r_i) |r_i|$. The reliability of a symbol $r_i$ is defined as its magnitude $\text{rel}_i \triangleq |r_i|$. According to this modification, a received symbol whose reliability exceeds a given threshold T, that is, $\text{rel}_i > T$, is judged to be highly reliable, and the code node associated with the symbol is selected as a highly reliable position (HRP). Hard decisions are made on received symbols judged to be highly reliable. The hard decision of a symbol $r_i$ is defined as $\mathfrak{d}_i = \text{sgn}(r_i)$.

Once a set of highly reliable positions (code nodes) is selected and the corresponding received symbols are fixed to their hard decision (HD) values, then the maximum absolute value $|\pi_{MAX}|$ of metrics $\pi_x(i,j)$ (0 ≤ j ≤ J−1) is outputted from the code node configuration (i.e., from the X processor 6), along with the sign of the received channel value as the estimated code bit $\mathfrak{d}_i = \text{sgn}(\text{LLR}(i))$. In other words, the configuration associated with the code node of highly reliable positions is not used in the decoding process. As a result, the check node configuration (i.e., the Z processor 6) performs fewer addition computations when adding F(||) values together to calculate the total sum S, because some of the inputted values are presumed to be highly reliable. This is because, from the definition of the F(x), we have that $F(|\pi_{MAX}|) = 0$. In practice, with the quantized function, the value $F_Q(|\pi_{MAX}|) = 0.1$ is fixed for the HRP and used throughout the iterative process.

Because the check node configuration (i.e., the Z processor 6) does not need to compute metrics associated with the highly reliable positions for input to the code node configuration, (i.e., the X-processor 4), fewer computations are required in terms of message passing and metric computation. With respect to message passing, there is no need to pass the metrics $\lambda_z$ from the corresponding check node configuration, because the metrics $\lambda_x$ for the code node configuration relating to the highly reliable positions are fixed. With respect to metric computation, there is no need to include their π-metrics in the computation of the λ-metrics in the check node configuration, because of the high reliability of the highly reliable positions in the code node configuration. Instead, in the λ-metric computation of equations (4) and (5), the smallest value of $F_Q(x)$ is always used for the highly reliable positions.

As a result, operations relating to message passing and metric computation of the highly reliable positions can be greatly reduced. This is particularly true if the channel conditions are good, that is, if the noise power level $N_0$ is low. In message passing, the X-to-Z propagation for the code node configuration remains the same. However, as mentioned before, the Z-to-X propagation from check node configuration to code node configuration in highly reliable positions are not needed because their values have been decided in advance. This step, for i=0,1, . . . , n−1, is modified so that for j ∈ {0, 1, . . . , J−1}, and Pz(i,j) ∉ L, wherein L is the set of indices of highly reliable positions, λ-metrics are loaded in the code node memory in the following manner:

$$\lambda_x(Pz(i,j), I_z(Pz(i,j))) = \lambda_z(i,j), I_z(Pz(i,j)) = I_z(Pz(i,j)) + 1$$

Using the example of FIG. 17, when n=0 is designated as a highly reliable position, then the metrics λz(0, 0), λz(3, 0), λz(5, 0), and λz(6, 0) will not be sent to the X processor 40 as metrics λx(0, 0), λx(0, 1), λx(0, 2), and λx(0, 3).

Figure 19:
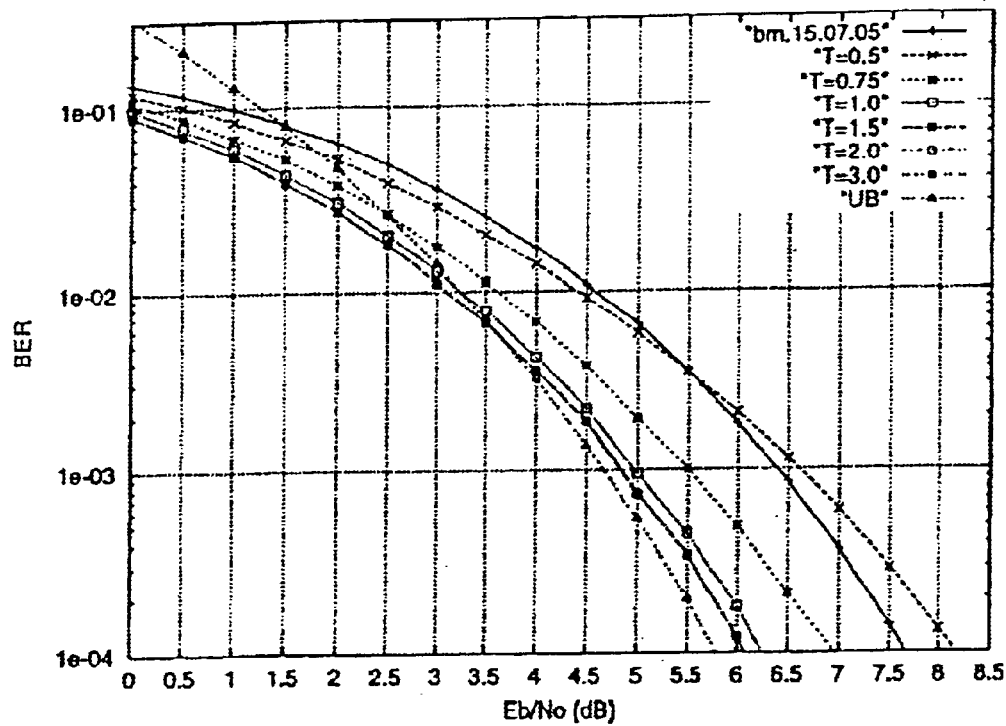
FIG. 19 is a graph showing how different thresholds for indicating highly reliable positions affects error performance.

FIG. 19 shows how different thresholds T for indicating highly reliable positions affects the error performance of iterative decoding of the binary BCH (15,7,5) code with 4 iterations. As a comparison, the bit error rate with hard decision decoding using the well known Berlekamp-Massey (bm) algorithm, and the union bound (UB) are also shown. As can be seen, a threshold value T=1.0 achieves excellent performance, that is, a bit error rate of $10^{-4}$ at only 0.17 dB away from the performance of iterative decoding without highly reliable positions. In other words, on the average 50% of the positions can be designated as highly reliable, and still achieve excellent performance. In addition, note that a threshold value of T=1.5 results in practically the same performance as if no symbols are considered highly reliable and, depending on the noise power spectral density $N_0$, includes up to 30% of the positions as highly reliable.

Figure 20:
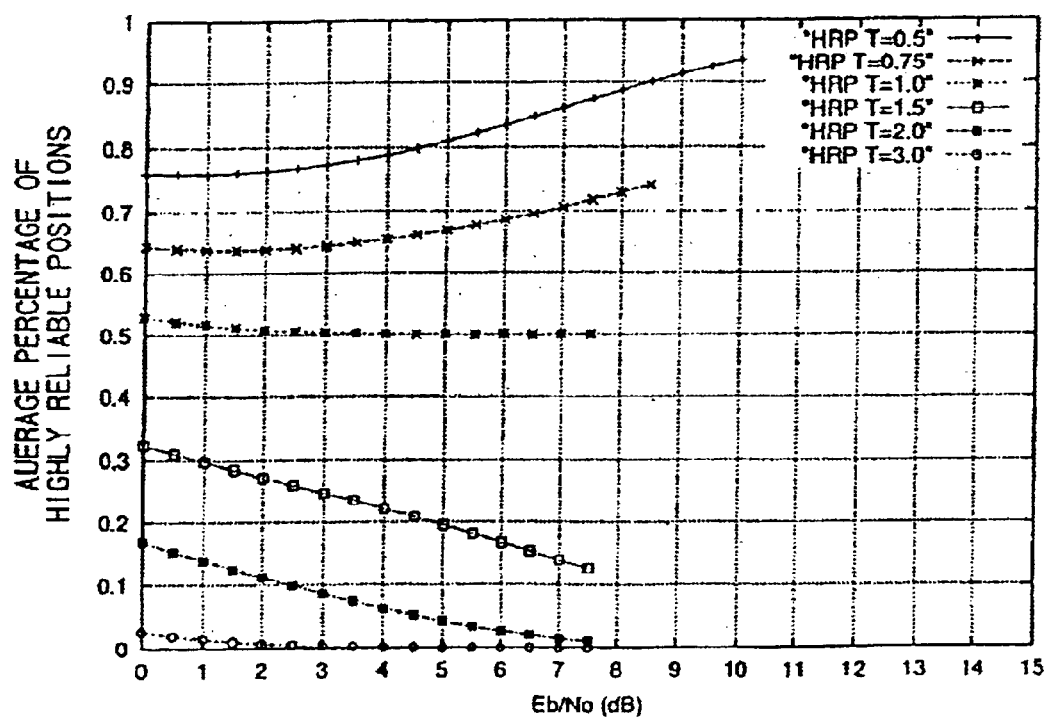
FIG. 20 is a graph showing how different thresholds influence the average percentage of positions judged to be highly reliable positions.

FIG. 20 shows how different thresholds T influence the average percentage of positions judged to be highly reliable positions in a received word for the binary BCH(15,7,5) code.

Instead of using a threshold to judge whether positions are highly reliable, a predetermined number $N_{hard}$ of the received symbols with the highest reliabilities can be judged as highly reliable. However, this requires "fine tuning" on a code-by-code basis, in order to determine the best values of $N_{hard}$. For implementation purposes, the threshold method is preferred, because fixing the number of HRP implies an ordering of the received channel reliability values, which increases the complexity of the iterative decoder.

While the invention has been described in detail with reference to specific embodiments thereof, it would be apparent to those skilled in the art that various changes and modifications may be made therein without departing from the spirit of the invention, the scope of which is defined by the attached claims.

For example, instead of inputting the parity-check polynomial to the decoder, the structure of matrix $H_e$ can be directly input to the decoder. However, this requires n×J integers, or n×J×$\log_2$n bits.

Also, in the embodiment, decoding parameters such as the parity-check polynomial h(x), the code length, positions of the coefficients of the parity-check polynomial, and the Hamming weights of the parity-check polynomial are transmitted in a header from the transmitter that includes the encoder. However, the decoding parameters could be transmitted as side information in a secondary channel. Alternatively, a processor of the receiver that includes the decoder could try all possible decoding parameters until the number of decoded bit errors falls below a certain threshold.

The embodiment describes the invention applied to a decoder for decoding binary cyclic codes. However, the invention could be applied to a decoder for decoding non-binary cyclic codes instead. Although, memory requirements would be substantially higher, an iterative decoder for nonbinary codes would be relatively simple to implement.

What is claimed is:

1. A decoder for decoding a data stream transmitted across a noisy channel into estimated bits, the data stream being encoded according to a cyclic code into a plurality of code words in sequence, the decoder comprising:
   input means for receiving input of a vector of noisy received values r(i) (where $0 \leq i \leq n-1$) of the data stream, a code length n of the code words, and a parity-check polynomial h(x) corresponding to the cyclic code, the parity-check polynomial h(x) having J-number of nonzero coefficients;
   a scaler for multiplying each noisy received value r(i) by a constant, and outputting each product as a log-likelihood ratio LLR(i);
   a Z processor for:
   receiving n-sets of $\pi z(i,j)$ metrics (where $0 \leq j \leq J-1$), each set including J-number of $\pi z(i,j)$ metrics; and
   calculating n-sets of $\lambda z(i,j)$ metrics based on the $\pi z(i,j)$ metrics, each set including J-number of $\lambda z(i,j)$ metrics;
   an X processor for:
   receiving n-sets of $\lambda x(i,j)$ metrics, each set including J-number of $\lambda x(i,j)$ metrics,
      calculating n-number of a-posteriori values q(i) based on the $\lambda x(i,j)$ metrics and the log-likelihood ratios LLR(i);
      calculating n-sets of $\pi x(i,j)$ metrics based on the $\lambda x(i,j)$ metrics and the a-posteriori values q(i), each set including J-number of $\pi x(i,j)$ metrics; and
      determining n-number of estimated code bits $\mathsf{\bar{a}}_i$ based on the a-posteriori values q(i); and
   an information exchange control unit for:
      distributing the $\pi x(i,j)$ metrics based on a cyclic shift of the parity-check polynomial h(x) to produce the $\pi z(i,j)$ metrics; and
      distributing the $\lambda z(i,j)$ metrics based on a reverse order of the cyclic shift of the parity-check polynomial h(x) to produce the $\lambda x(i,j)$ metrics.

2. A decoder as claimed in claim 1, further comprising:
   a $\pi$ RAM connected to an output of the X processor and an input of the Z processor, the information exchange control unit organizing the $\pi$ RAM into a J-by-n array with J columns and n rows based on the inputted code length n and the inputted parity-check polynomial h(x), the information exchange control unit distributing the $\pi x(i,j)$ metrics from the X processor into the $\pi$ RAM based on the cyclic shift of the parity-check polynomial h(x) and transferring to the Z processor the J-number of $\pi x(i,j)$ metrics in each column of the $\pi$ RAM as one of the n-sets of $\pi z(i,j)$ metrics; and
   a $\lambda$ RAM connected to an output of the Z processor and an input of the X processor, the information exchange control unit organizing the $\lambda$ RAM into a J-by-n array with J columns and n rows based on the inputted code length n and the inputted parity-check polynomial h(x), the information exchange control unit distributing the $\lambda z(i,j)$ metrics from the Z processor into the $\lambda$ RAM based on the reverse order of the cyclic shift of the parity-check polynomial h(x) and transferring to the X processor the J-number of $\lambda z(i,j)$ metrics in each column of the $\lambda$ RAM as one of the n-sets of $\lambda x(i,j)$ metrics.

3. An decoder as claimed in claim 2, wherein the Z processor computes the $\lambda z(i,j)$ metrics using the following quantized version $F_Q(x)$ of the function $F(x)=\log[(e^x+1)/(e^x-1)]$:

$$F_Q(x) = \begin{cases} 5.00, & 0 \leq x \leq 0.10; \\ 2.25, & 0.10 \leq x \leq 0.35; \\ 1.50, & 0.35 \leq x \leq 0.60; \\ 1.00, & 0.60 \leq x \leq 0.90; \\ 0.75, & 0.90 \leq x \leq 1.20; \\ 0.50, & 1.20 \leq x \leq 1.60; \\ 0.30, & 1.60 \leq x \leq 2.30 \\ 0.10, & 2.30 \leq x. \end{cases}$$

4. A decoder as claimed in claim 1, further comprising a bus connecting the Z processor, the X processor, and the information exchange control unit to each other, the Z processor including n-number of $Z_i$ processors each connected to the bus with an individual address, the X processor including n-number of $X_i$ processors each connected to the bus with an individual address, the information exchange control unit including an address computation unit for transferring, across the bus, the $\pi x(i,j)$ metrics from the $X_i$ processors as $\pi z(i,j)$ metrics to $Z_i$ processors determined based on the cyclic shift of the parity-check polynomial h(x) and the $\lambda z(i,j)$ metrics from the $Z_i$ processors as $\lambda x(i,j)$ metrics to $X_i$ processors determined based on the reverse order of the cyclic shift of the parity-check polynomial h(x).

5. A decoder as claimed in claim 1, wherein the Z processor computes the $\lambda z(i,j)$ metrics based on:

$$\lambda_z(i,j) = (-1)^{\delta \oplus Sgn(\pi_z(i,j))}(S - F_Q(|\pi_z(i,j)|))$$

wherein:

$$S = (-1)^\delta \sum_{j=0}^{J-1} F_Q(|\pi_z(i,j)|),$$

$\delta = (-1)^{\oplus_{j-1j=0} sgn\ (\pi_z(i,j))}$, and $F_Q(x)$ denotes a quantized version of the function $F(x) = \log[(e^x+1)/(e^x-1)]$.

6. A decoder as claimed in claim 1, wherein the X processor calculates the a-posteriori values q(i) based on $$q(i) = \sum_{j=0}^{J-1} \lambda_x(i,j) + LLR(i),$$

calculates the $\pi x(i,j)$ metrics based on $\pi_x(i,j) = q(i) - \lambda_x(i,j)$, and determines the n-number of estimated code bits based on $\mathsf{\bar{a}}_i = \mathrm{sgn}(q(i))$.

7. A decoder as claimed in claim 1, wherein the constant used by the scaler equals 4/spectral density No of the noisy channel.

8. A decoder as claimed in claim 1, wherein the input means further receives input of a fixed number of iterations, the X processor determining the n-number of estimated code bits $\bar{a}_i$ after the fixed number of iterations.

9. A decoder as claimed in claim 1, wherein the information exchange control unit performs the cyclic shifts of the parity-check polynomial h(x) by multiplying successive ones of $x^0$ to $x^{n-1}$ times the parity-check polynomial h(x) and performs the reverse order of the cyclic shifts of the parity-check polynomial h(x) by multiplying successive ones of $x^0$ to $x^{n-1}$ times the reciprocal $h^{-1}(x)$ ($x^n h(x^{-1})$) of the parity-check polynomial h(x).

10. A decoder as claimed in claim 1, wherein in a first iteration the X processor makes preliminary hard decisions on the a-posteriori values q(i) to produce hard decision values for highly reliable positions, the information exchange control unit using the hard decisions when distributing the $\pi x(i,j)$ metrics and the $\lambda z(i,j)$ metrics.

11. A decoder as claimed in claim 10, wherein the Z processor makes the preliminary hard decisions based on whether a a-posteriori value q(i) exceeds a threshold T.

* * * * *